(12) United States Patent
Fukayama et al.

(10) Patent No.: US 6,731,181 B2
(45) Date of Patent: May 4, 2004

(54) TEMPERATURE COMPENSATED OSCILLATOR USING A CONTROL VOLTAGE GENERATION CIRCUIT

(75) Inventors: Hiroyuki Fukayama, Sayama (JP); Yasuhiro Sakurai, Sayama (JP)

(73) Assignee: Citizen Watch Co., Ltd., Tokyo (JP)

(*) Notice: Subject to any disclaimer, the term of this patent is extended or adjusted under 35 U.S.C. 154(b) by 0 days.

(21) Appl. No.: 10/149,419

(22) PCT Filed: Aug. 28, 2001

(86) PCT No.: PCT/JP01/07372
§ 371 (c)(1),
(2), (4) Date: Jun. 21, 2002

(87) PCT Pub. No.: WO02/19514
PCT Pub. Date: Mar. 7, 2002

(65) Prior Publication Data
US 2002/0180544 A1 Dec. 5, 2002

(30) Foreign Application Priority Data
Aug. 31, 2000 (JP) ......... 2000-262215

(51) Int. Cl.[7] .................. H03L 1/00
(52) U.S. Cl. .................. 331/176; 331/177 R
(58) Field of Search .................. 331/176, 177 R

(56) References Cited

U.S. PATENT DOCUMENTS
5,389,899 A * 2/1995 Yahagi et al. .......... 331/10
6,239,662 B1 * 5/2001 Fukuyama et al. ...... 331/66

FOREIGN PATENT DOCUMENTS
| JP | 8-116214 | 5/1996 |
|----|----------|--------|
| JP | 11-4119 | 1/1999 |
| JP | 2000-188514 | 7/2000 |
| JP | 2001-68933 | 3/2001 |
| JP | 2001-127549 | 5/2001 |

* cited by examiner

Primary Examiner—Kenneth Wells
(74) Attorney, Agent, or Firm—Westerman, Hattori, Daniels & Adrian, LLP

(57) ABSTRACT

The temperature of an oscillation circuit (47) is detected by a temperature detection circuit (13), a cubic term voltage generation circuit of a control voltage generation circuit (23) generates a cubic term voltage as a control voltage based on an output voltage of the temperature detection circuit (13), and a frequency adjustment circuit (45) changes an oscillation frequency of the oscillation circuit (47) by the control voltage. The cubic term voltage generation circuit includes a first MOS transistor (37) having a source connected to a first power line (25), a second MOS transistor (35) having a source connected to a second power line (26), and digital control voltage division circuits (31, 33) for generating a first and a second gate voltage, respectively based on the output voltage of the temperature detection circuit (13), in which the first and second gate voltages are applied to gates of the first and second MOS transistors (37, 35) respectively, and a connection point (44) where respective drains are commonly connected shall be an output terminal of the control voltage.

35 Claims, 11 Drawing Sheets

US 6,731,181 B2

TEMPERATURE COMPENSATED OSCILLATOR USING A CONTROL VOLTAGE GENERATION CIRCUIT

TECHNICAL FIELD

The present invention relates to a temperature compensated oscillator in which temperature characteristics of a crystal oscillator using a crystal resonator are compensated.

BACKGROUND TECHNOLOGY

A crystal oscillator using a crystal resonator is superior in stability of frequency to other oscillators, but when it is used as a reference oscillator for mobile radio communication in recent years, variations in oscillation frequency caused by temperature characteristics of the crystal resonator present a problem. In order to solve the problem, a so-called temperature compensated oscillator is widely used in which temperature characteristics of a crystal resonator are compensated.

Among the temperature compensated oscillators, one by a method called indirect method has been reduced in the number of parts and improved in performance with recent developments in the integrated circuit technology.

The principle of compensating temperature of the temperature compensated oscillator by the indirect method is explained using FIG. 17.

A temperature detection circuit 91 in FIG. 17 generates a temperature detection voltage depending on a temperature. The voltage is inputted to a high temperature part/low temperature part separation circuit 92 and a gradient correction voltage generation circuit 93. The high temperature part/low temperature part separation circuit 92 separates the voltage inputted thereto into two for a low temperature part and for a high temperature part and inputs them to a low temperature part cubic curve voltage generation circuit 94 and a high temperature part cubic curve voltage generation circuit 95, respectively.

Voltages individually outputted from the low temperature part cubic curve voltage generation circuit 94, the high temperature part cubic curve voltage generation circuit 95, the gradient correction voltage generation circuit 93, and a standard frequency adjustment voltage generation circuit 96 are inputted to an adding circuit 97 to be added, and outputted to a frequency adjustment circuit 98.

The frequency adjustment circuit 98 controls an oscillation frequency of an oscillation circuit 99, having a crystal resonator 90 by the inputted voltage. Further, the frequency adjustment circuit 98 adjusts a standard oscillation frequency at a prescribed temperature by the voltage outputted from the standard frequency adjustment voltage generation circuit 96.

The cubic curve voltage generation circuit only generates a voltage obtained by cubing the inputted voltage, and thus it can only generate a voltage in a first quadrant which is half of a cubic curve in a two-dimensional plane of the input voltage and the output voltage.

Hence, in order to obtain sequential cubic curve voltages, it is necessary to use the low temperature part cubic curve voltage generation circuit 94 which generates a cubic curve voltage by inverting the input voltage and the output voltage and the high temperature part cubic curve voltage generation circuit 95 which generates a cubic curve voltage by an normal operation, and to add the respective output voltages.

This requires the high temperature part/low temperature part separation circuit 92, the low temperature part cubic curve voltage generation circuit 94, and the high temperature part cubic curve voltage generation circuit 95.

In the above-described series of operations, the low temperature part cubic curve voltage generation circuit 94 and the high temperature part cubic curve voltage generation circuit 95 generate voltages such that the frequency adjustment circuit 98 compensates cubic temperature characteristics of an AT cut crystal, and the gradient correction voltage generation circuit 93 generates a voltage such that the frequency adjustment circuit 98 compensates linear temperature characteristics of the AT cut crystal.

These voltages are added in the adding circuit 97 and inputted to the frequency adjustment circuit 98, so as to compensate the oscillation frequency of the oscillation circuit 99 changing due to temperature. In such a manner, the oscillation frequency of the temperature compensated oscillator can be held constant, even if the temperature changes.

Such a conventional technique, however, has problems that since the high temperature part/low temperature part separation circuit for separating the voltage from the temperature detection circuit for a low temperature part and a high temperature part, the two cubic curve voltage generation circuits, the gradient correction voltage generation circuit, and the adding circuit are required in order to compensate the temperature characteristics of the AT cut crystal as described above, the circuit increases in size, and that the above circuits individually require complicated adjustment in order to correct variations in fabrication.

Hence, it is an object of the present invention to solve the problems and to provide a temperature compensated oscillator that has a simple circuit configuration suitable for downsizing and requires just easy adjustment.

DISCLOSURE OF THE INVENTION

In order to attain the above object, a temperature compensated oscillator according to the invention, which comprises: an oscillation circuit; a frequency adjustment circuit for changing an oscillation frequency of the oscillation circuit by a control voltage; a temperature detection circuit for detecting a temperature in the vicinity of the oscillation circuit and generating at least one output voltage based on the detected temperature; and a control voltage generation circuit including a cubic term voltage generation circuit for generating a cubic term voltage as the control voltage based on the output voltage from the temperature detection circuit, is characterized in that the cubic term voltage generation circuit is configured as follows:

Specifically, the cubic term voltage generation circuit comprises: a first MOS transistor having a source connected to a first power line; a second MOS transistor having a conduction type different from that of the first MOS transistor and a source connected to a second power line; and a first gate voltage generation circuit for generating a first gate voltage and a second gate voltage generation circuit for generating a second gate voltage respectively based on the output voltage of the temperature detection circuit.

Further, an output terminal for outputting the first gate voltage of the first gate voltage generation circuit is connected to a gate of the first MOS transistor, an output terminal for outputting the second gate voltage of the second gate voltage generating circuit is connected to a gate of the second MOS transistor, and a drain of the first MOS transistor and a drain of the second MOS transistor are commonly connected to be an output terminal of the control voltage.

It is preferable that the second power line has a polarity opposite to that of the first power line or is at the ground potential.

Further, in the case of a temperature compensated circuit in which the control voltage generation circuit includes, in place of the cubic term voltage generation circuit, a quadratic term voltage generation circuit for generating a quadratic term voltage as the control voltage based on the output voltage from the temperature detection circuit, only the following points of the configuration of the cubic term voltage generation circuit should be changed to obtain a configuration of the quadratic term voltage generation circuit.

Specifically, the second MOS transistor has the same conduction type as that of the first MOS transistor and a source is connected to the second power line.

The second power line in this case preferably has the same polarity as that of the first power line or may be the same as the first power line.

In these temperature compensated oscillators, the output terminal of the control voltage is preferably connected to at least one arbitrary voltage source via a resistance element having a resistance value of 100 kilohms or more.

In the case of the temperature compensated oscillator which comprises the control voltage generation circuit including the cubic term voltage generation circuit, it is preferable that the output terminal of the control voltage is connected to the first power line or a power line having the same polarity as that of the first power line via a first resistance element as well as to the second power line or a power line having the same polarity as that of the second power line via a second resistance element.

It is possible to use resistance elements that are different in temperature coefficient with respect to resistance value as the first resistance element and the second resistance element.

Further, it is preferable that a plurality of pairs of resistance elements having different combinations of temperature coefficients with respect to resistance values are provided as the first resistance element and the second resistance element, and switches for selectively switching to any of the plurality of pairs of resistance elements for use are provided.

In any of the temperature compensated oscillators, it is preferable that at least one of the first and second gate voltage generation circuits is a circuit for generating the first or the second gate voltage based on a difference between the output voltage of the temperature detection circuit and an arbitrary reference voltage.

Alternatively, it is possible that at least one of the first and second gate voltage generation circuits is a circuit capable of controlling the generated gate voltage thereof based on external data. Further, it is also possible that a memory circuit for storing the external data is provided, and at least one of the first and second gate voltage generation circuits is a circuit capable of controlling the generated gate voltage thereof based on the data stored in the memory circuit.

It is adoptable that at least one of the first and second gate voltage generation circuits is a voltage division circuit for dividing a voltage difference between the output voltage of the temperature detection circuit and the arbitrary reference voltage. The arbitrary reference voltage may also be a voltage of the first power line or the second power line.

In the case of the temperature compensated oscillator which comprises the control voltage generation circuit including the cubic term voltage generation circuit, it is preferable that the control voltage generation circuit outputs the cubic term voltage generated by the cubic term voltage generation circuit as a first control voltage, further comprises a linear term voltage generation circuit for generating a linear term voltage based on the output voltage of the temperature detection circuit, and outputs the linear term voltage generated by the linear term voltage generation circuit as a second control voltage, and that the frequency adjustment circuit is a circuit for controlling the oscillation frequency of the oscillation circuit by the first control voltage and the second control voltage.

The linear term voltage generation circuit may be an operational amplifier circuit. Further, it is preferable that a memory circuit is provided which stores data from the outside and controls an amplification factor and an offset input voltage of the operational amplifier circuit based on the stored digital data.

Alternatively, the temperature detection circuit may also be a circuit which comprises two temperature sensors different in temperature gradient and divides a difference between output voltages of the two temperature sensors into an arbitrary ratio to output it as a temperature detection voltage.

It is preferable that the frequency adjustment circuit comprises a voltage variable capacitance element such as a MIS variable capacitor or the like which constitutes a load capacitance of the oscillation circuit and of which capacitance value is changed by the control voltage. In this case, it is preferable that the first control voltage is applied to one electrode of the voltage variable capacitance element and the second control voltage is applied to another electrode thereof.

Alternatively, it is also possible that the voltage variable capacitance elements are constituted by a first voltage variable capacitance element to which the first control voltage is applied and a second voltage variable capacitance element to which the second control voltage is applied which are connected in parallel.

Further, it is preferable that each source of the first and second MOS transistors in the control voltage generation circuit is connected to the first or second power line via a resistance element for limiting a drain current.

It is also adoptable that the resistance element is a digital control variable resistance circuit, and that a memory circuit is provided which is capable of controlling a resistance value of the digital control variable resistance circuit based on digital data stored therein. It is preferable that the memory circuit is capable of controlling storage and read of digital data from the outside via a serial input/output line.

It is possible to use temperature detection circuits having various types of temperature sensors and circuit configurations such as one in which temperature and the output voltage are in a proportional relationship, one in which they are in an inversely proportional relationship, one in which a plurality of temperature gradients can be selected, and the like as the above-described temperature detection circuit.

Further, when a preset temperature range in a temperature range in use of each of the temperature compensated oscillators is defined as a second temperature area, a temperature range on a lower temperature side than that is defined as a first temperature area, and a temperature range on a high temperature side exceeding the second temperature area is defined as a third temperature area, it is desirable to have a configuration as follows:

The first gate voltage generation circuit has an area in which the first gate voltage linearly changes with respect to changes in temperature at least in the third temperature area, and the second gate voltage generation circuit has an area in which the second gate voltage linearly changes with respect to changes in temperature at least in the first temperature area.

BEST MODE FOR CARRYING OUT THE INVENTION

In order to detail the present invention, preferred embodiments of the invention will be explained using the accompanying drawings.

Configuration of a First Embodiment: FIG. 1 to FIG. 4

Figure 1:
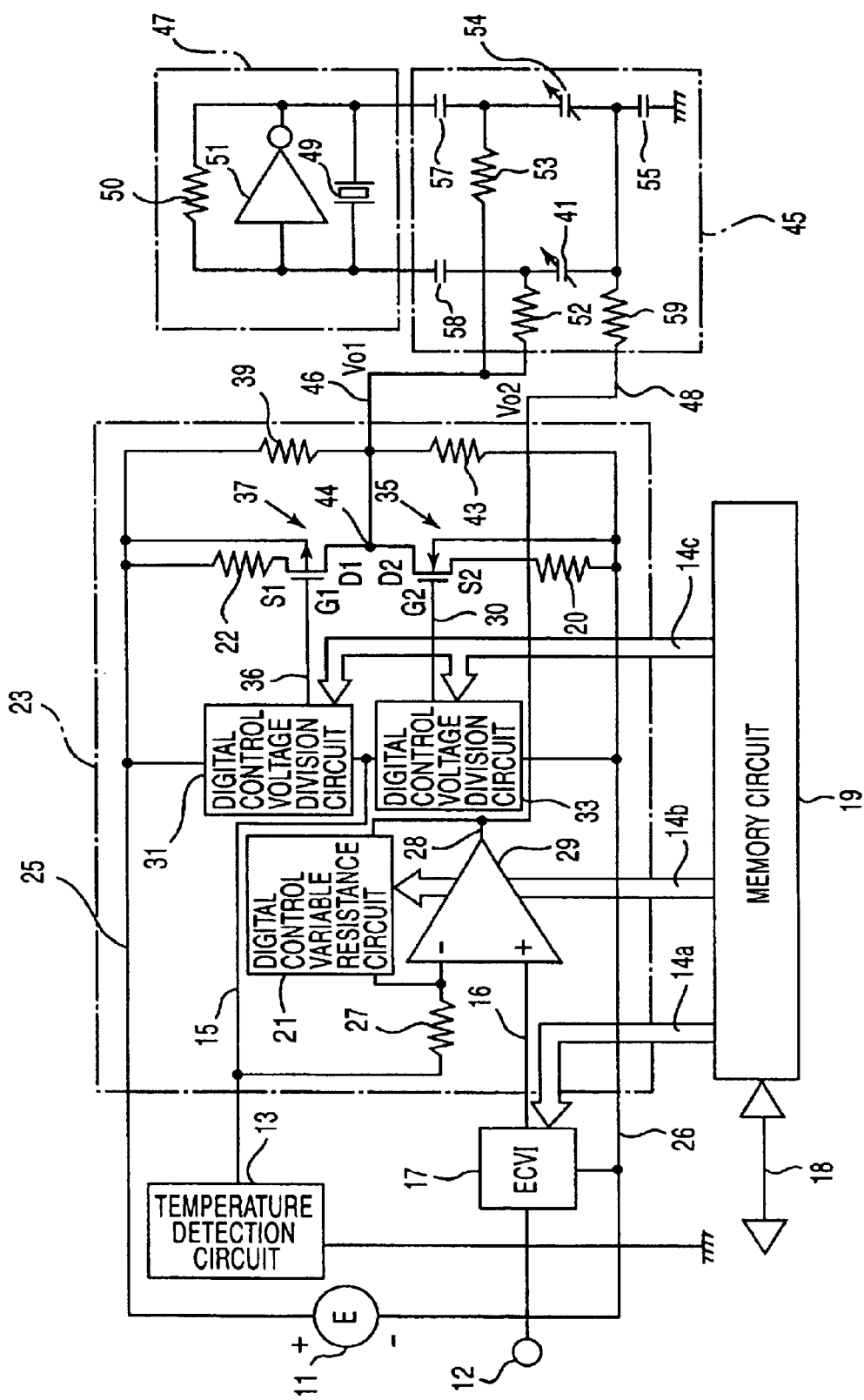
FIG. 1 is a block circuit diagram showing a configuration of a first embodiment of a temperature compensated oscillator according to the present invention.

FIG. 1 is a block circuit diagram showing the configuration of the first embodiment of a temperature compensated oscillator according to the invention. The temperature compensated oscillator is constituted by a power supply 11, an input terminal 12, a control voltage generation circuit 23, a temperature detection circuit 13, an external control voltage input circuit 17, a frequency adjustment circuit 45, an oscillation circuit 47, and a memory circuit 19.

The control voltage generation circuit 23 is constituted, as shown in FIG. 1, by an operational amplifier circuit 29, a P-channel MOS transistor 37, an N-channel MOS transistor 35, a first resistance element 39, a second resistance element 43, a third resistance element 22, a fourth resistance element 20, digital control voltage division circuits 31 and 33 constituting a first and a second gate voltage generation circuit, a digital control variable resistance circuit 21, and a resistance element 27.

Particularly, the P-channel MOS transistor 37, the N-channel MOS transistor 35, and the digital control voltage division circuits 31 and 33 constitute a cubic term voltage generation circuit.

The frequency adjustment circuit 45 is constituted by MIS variable capacitors 41 and 54, resistance elements 52, 53 and 59, and capacitance elements 55, 57 and 58. The oscillation circuit 47 is constituted by a crystal resonator 49 being a piezoelectric resonator, an inverter 51, and a feedback resistance element 50. Each of the MIS variable capacitors 41 and 54 is a capacitance element constituting a load capacitance of the oscillation circuit 47 and being a voltage variable capacitance element of which capacitance value is changed by a control voltage.

Figure 2:
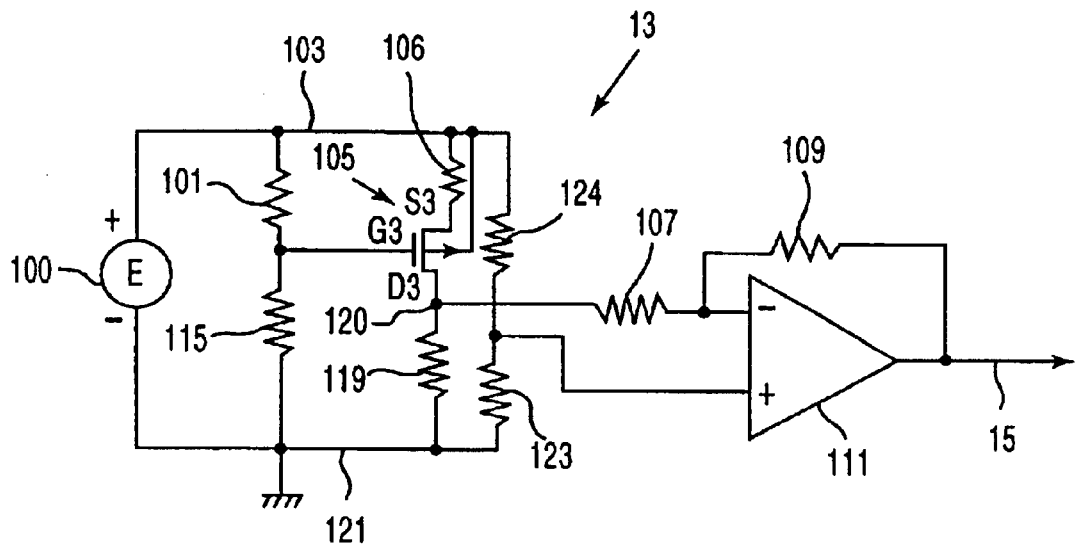
FIG. 2 is a circuit diagram showing a specific configuration example of a temperature detection circuit 13 in FIG. 1.

The temperature detection circuit 13 is constituted, as shown in FIG. 2, by a power supply 100, a P-channel MOS transistor 105, resistance elements 119 and 106, an operational amplifier circuit 111, and so on. The detailed configuration thereof is described later.

The power supply 100 of the temperature detection circuit 13 is unnecessary to be common with the power supply 11 of the control voltage generation circuit 23, and power is generally supplied from different regulators in order to optimize power-supply voltages separately for the circuits in an actual integrated circuit (IC). Specifically, the power supply 11 shown in FIG. 1 is constituted by a regulator, and the power supply 100 of the temperature detection circuit 13 shown in FIG. 2, a power supply (a later-described power supply 130 shown in FIG. 3) of the external control voltage input circuit 17, and a power supply of the oscillation circuit 47 are also constituted by separately provided regulators.

Therefore, in order to eliminate complication of the drawing in this embodiment, the temperature detection circuit 13 in FIG. 1 is shown as a circuit including the power supply. This similarly applies to the later-described external control voltage input circuit 17.

Figure 3:
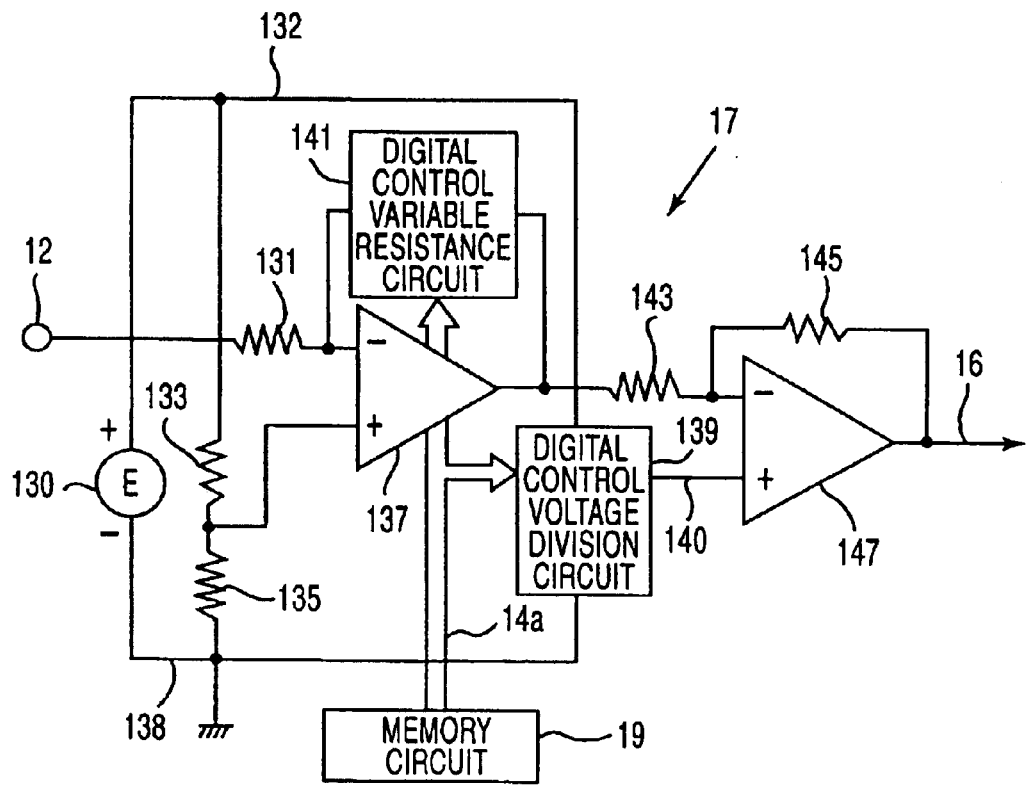
FIG. 3 is a block circuit diagram showing a specific configuration example of an external control voltage input circuit 17 in FIG. 1.

The external control voltage input circuit 17 is constituted, as shown in FIG. 3, by the power supply 130, operational amplifier circuits 137 and 147, a digital control variable resistance circuit 141, a digital control voltage division circuit 139, and so on. The detail is described later.

The memory circuit 19 is constituted by a nonvolatile memory. Alternatively, the memory circuit 19 can be constituted by a one-time memory that is writable only once or a mask ROM being a read-only memory.

In the control voltage generation circuit 23 shown in FIG. 1, the digital control voltage division circuits 31 and 33 are circuits each arbitrarily divides a difference between voltages applied to both terminals thereof based on a digital signal and outputs it.

Figure 4:
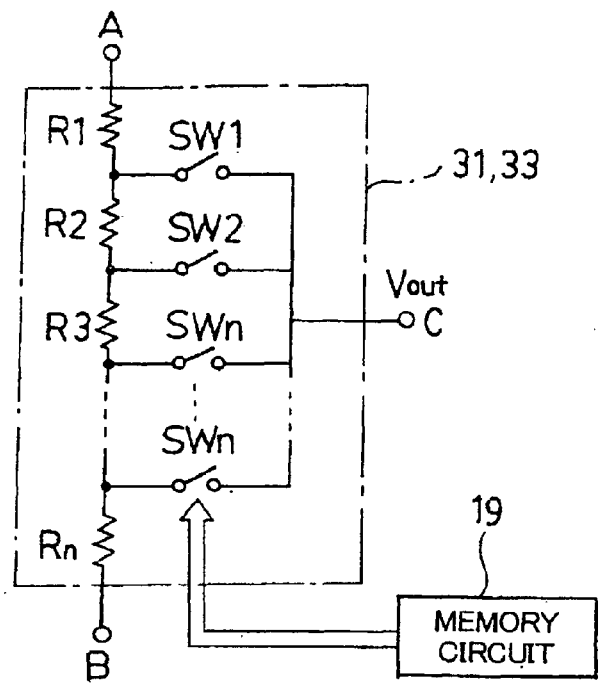
FIG. 4 is a block circuit diagram showing a specific configuration example of digital control voltage division circuits 31 and 33 in FIG. 1.

For example, as shown in FIG. 4, a plurality of resistance elements R1 to Rn are connected in series between voltage input terminals A and B, and switch elements SW1 to SWn are connected between respective connection points and a voltage output terminal C, so that one or a plurality of the switch elements SW1 to SWn is/are selectively turned on by a digital signal from the memory circuit 19, thereby outputting to the voltage output terminal C a voltage obtained by arbitrarily dividing a voltage applied between the voltage input terminals A and B.

Further, both terminals (the voltage input terminals A and B in FIG. 4) of one digital control voltage division circuit 31 shown in FIG. 1 are connected to a positive power line 25 (whose voltage shall be a reference voltage) which is connected to a positive terminal of the power supply 11 of the control voltage generation circuit 23 and an output voltage line 15 of the temperature detection circuit 13, respectively. Both terminals (the voltage input terminals A and B in FIG. 4) of the other digital control voltage division circuit 33 are connected to the output voltage line 15 of the temperature detection circuit 13 and a ground power line (or a negative power line) 26 which is connected to a negative terminal of the power supply 11 and the ground, respectively.

It should be noted that the reference voltages applied to the digital control voltage division circuits 31 and 33 are not required to be the voltages of the positive power line 25 and the ground power line 26, and a voltage from an arbitrary power supply can be used.

Moreover, the digital control voltage division circuits 31 and 33 are the first and second gate voltage generation circuits and divide respective voltage differences based on differences between the output voltage of the temperature detection circuit 13 and the respective reference voltages to generate a first and a second gate voltage in this embodiment, but the arrangement is not limited to the above.

The divided voltage output of the digital control voltage division circuit 31 is inputted to a gate G1 of the P-channel MOS transistor 37 as the first gate voltage via a signal line 36 connected to the voltage output terminal C in FIG. 4, and the divided voltage output of the digital control voltage division circuit 33 is inputted to a gate G2 of the N-channel MOS transistor 35 as the second gate voltage via a similar signal line 30.

The digital control voltage division circuit 31 constitutes the first gate voltage generation circuit, and the digital control voltage division circuit 33 constitutes the second gate voltage generation circuit.

Further, a source S1 of the P-channel MOS transistor 37 is connected to the positive power line 25 of the control voltage generation circuit 23 via the third resistance element 22, and a source S2 of the N-channel MOS transistor 35 is connected to the ground power line 26 of the control voltage generation circuit 23 via the fourth resistance element 20.

Furthermore, a drain D1 of the P-channel MOS transistor 37 is connected to the positive power line 25 via the first resistance element 39, and a drain D2 of the N-channel MOS transistor 35 is connected to the ground power line 26 via the second resistance element 43. The drain D1 of the p-channel MOS transistor 37 and the drain D2 of the N-channel MOS transistor 35 are connected to each other to form a drain connection point 44.

In this embodiment, the positive power line 25 is a first power line at a first potential, and the ground power line 26 is a second power line having a polarity opposite to that of the first power line or being at the ground potential. Therefore, the second power line might be a negative power line that is connected to the negative terminal of the power supply 11 but not grounded.

In FIG. 1, a first control voltage Vo1 outputted from the drain connection point 44 of the control voltage generation circuit 23 and a second control voltage Vo2 outputted from the operational amplifier circuit 29 are inputted to the frequency adjustment circuit 45 via a signal line 46 and a signal line 48, respectively.

In the temperature detection circuit 13 shown in FIG. 2, a gate G3 of the P-channel MOS transistor 105 is connected to a positive power line 103 of the temperature detection circuit 13 via a resistance element 101 as well as to a ground power line 121 via a resistance element 115. The positive power line 103 is connected to a positive terminal of the power supply 100, and the ground power line 121 is connected to a negative terminal of the power supply 100 and the ground, respectively.

Further, a source S3 of the P-channel MOS transistor 105 is connected to the positive power line 103 of the temperature detection circuit 13 via the resistance element 106, and a drain D3 thereof is connected to the ground power line 121 via the resistance element 119.

An output voltage at a connection point 120 between the resistance element 119 and the drain D3 of the P-channel MOS transistor 105 is inputted to a negative input terminal of the operational amplifier circuit 111 via a resistance element 107, and the negative input terminal of the operational amplifier circuit 111 is connected to an output terminal of the operational amplifier circuit 111 itself via a resistance element 109. Furthermore, a positive input terminal of the operational amplifier circuit 111 is connected to the positive power line 103 via a resistance element 124 as well as to the ground power line 121 via a resistance element 123 respectively to input an offset voltage thereto.

The output voltage of the operational amplifier circuit 111 is a temperature detection voltage, which is inputted, as described above, to the digital control voltage division circuits 31 and 33 via the signal line 15 as well as to a negative input terminal of the operational amplifier circuit 29 via the resistance element 27, as the output voltage of the temperature detection circuit 13 shown in FIG. 1. The negative input terminal of the operational amplifier circuit 29 is connected to an output terminal 28 of the operational amplifier circuit 29 itself via the digital control variable resistance circuit 21.

In the temperature detection circuit 13 shown in FIG. 2, the resistance elements 101 and 115 constitute a gate voltage generator for the P-channel MOS transistor 105. Further, the positive power line 103 is a first power line, and the ground power line 121 is a second power line having a polarity opposite to that of the first power line or being at the ground potential.

Since a voltage produced across the resistance element 106 is applied having a polarity opposite to that of the voltage between the gate G3 and the source S3 (a so-called gate voltage) of the P-channel MOS transistor, the voltage have an action of reducing a drain current of the P-channel MOS transistor 105. This action becomes more prominent as the drain current (as well as a source current) of the P-channel MOS transistor 105 increases to exert a kind of negative feedback action on the drain current of the P-channel MOS transistor 105, which presents effects of not only improving the linearity of the drain current of the P-channel MOS transistor 105 to the temperature but also restraining influence on variation in fabrication thereof.

The output voltage of the operational amplifier circuit 111 is outputted as the temperature detection voltage of the temperature detection circuit 13 in this embodiment, but not limited to that, and it is also adoptable to output, for example, the voltage generated at the connection point 120 between the resistance element 119 and the drain D3 of the P-channel MOS transistor 105, as it is, as the temperature detection voltage of the temperature detection circuit 13.

In the external control voltage input circuit 17 shown in FIG. 3, an external voltage is inputted from the input terminal 12 to a negative input terminal of the operational amplifier circuit 137 via a resistance element 131, and the negative input terminal of the operational amplifier circuit 137 is connected to an output terminal of the operational amplifier circuit 137 itself via the digital control variable resistance circuit 141.

Further, a positive input terminal of the operational amplifier circuit 137 is connected to a positive power line 132 of the external control voltage input circuit 17 via a resistance element 133 as well as to a ground power line 138 via a resistance element 135 to input an offset voltage thereto.

An output of the operational amplifier circuit 137 is inputted to a negative input terminal of the operational amplifier circuit 147 via a resistance element 143, and the negative input terminal of the operational amplifier circuit 147 is connected to an output terminal of the operational amplifier circuit 147 itself via a resistance element 145. An output of the operational amplifier circuit 147 is an output of the external control voltage input circuit 17 and is inputted as an offset voltage to a positive input terminal of the operational amplifier circuit 29 of the control voltage generation circuit 23 shown in FIG. 1 via a signal line 16.

In this embodiment, the resistance elements 133 and 135 shown in FIG. 3 constitute an offset voltage generator for the operational amplifier circuit 137.

A voltage range of the external voltage is prescribed in accordance with specifications of a product, and if an external voltage in the prescribed voltage range is inputted as it is as the offset voltage of the operational amplifier circuit 29, it is impossible to obtain a desired variation in frequency because the external voltage poorly matches with a voltage value required by the control voltage generation circuit 23. Therefore, the variation range of the external voltage is generally compressed, and an appropriate offset is added if necessary. The adjustment of the compression rate and the addition of the offset are performed in the external control voltage input circuit 17. The principle of operation thereof will be detailed later.

Both terminals of the digital control voltage division circuit 139 which has the same function as that of the above-described digital control voltage division circuits 31 and 33 are connected to the positive power line 132 and the ground power line 138 of the external control voltage input circuit 17, and a divided voltage output of the digital control voltage division circuit 139 is inputted to a positive input terminal of the operational amplifier circuit 147 as an offset voltage via a signal line 140.

In this embodiment, the offset input voltage to the operational amplifier circuit 147 is adjusted by the divided voltage output of the digital control voltage division circuit 139.

In the frequency adjustment circuit 45 shown in FIG. 1, the first control voltage Vo1 of the control voltage generation circuit 23 is inputted to a gate electrode that is one of electrodes of the MIS variable capacitor 41 via the signal line 46 and the resistance element 52 as well as to a gate electrode of the MIS variable capacitor 54 via the signal line 46 and the resistance element 53.

Further, the second control voltage Vo2 of the control voltage generation circuit 23 is inputted to substrate electrodes that are the respective other electrodes of the MIS variable capacitors 41 and 54 via the signal line 48 and the resistance element 59.

The gate electrodes of the MIS variable capacitors 41 and 54 are connected to the oscillation circuit 47 via the capacitance element 58 or 57 respectively, and the respective substrate electrodes are grounded (connected to the ground power line) via the capacitance element 55.

The oscillation circuit 47 is a crystal oscillation circuit in which the resistance element 50 and the crystal resonator 49 are connected in parallel between an input terminal and an output terminal of the inverter 51, and both terminals of the crystal resonator 49 are connected to the capacitance elements 58 and 57 of the frequency adjustment circuit 45, respectively.

The memory circuit 19 is connected with a serial input/output line 18 that controls memory and read of digital data, and three parallel output lines 14a, 14b and 14c each of which outputs digital data.

Operation of the First Embodiment: FIG. 1 to FIG. 8

Next, the operation of the above-described temperature compensated oscillator is explained with reference also to FIG. 5 to FIG. 8 in addition to FIG. 1 to FIG. 4 which have been already explained.

In FIG. 1, the temperature detection circuit 13 detects the temperature of the oscillation circuit 47, and outputs a voltage depending on the temperature to the control voltage generation circuit 23.

Hence, first of all, explanation is made on the principle of operation of generating the above-described first control voltage Vo1 by the control voltage generation circuit 23.

In the temperature detection circuit 13, a voltage, which is obtained by dividing a power-supply voltage between the positive power line 103 and the ground power line 121, generated by the power supply 100 of the temperature detection circuit 13, by the resistance elements 101 and 115, is inputted to the gate G3 of the P-channel MOS transistor 105 shown in FIG. 2 in order to pass an electric current through the drain D3. Then, as the temperature changes from a low temperature to a high temperature, the drain current of the p-channel MOS transistor 105 increases and the voltage at the connection point 120 between the resistance element 119 and the drain D3 linearly increases.

Since the voltage at the connection point 120 is inputted to the negative input terminal of the operational amplifier circuit 111 via the resistance element 107, the operation of the operational amplifier circuit 111 becomes inverse amplification and its output voltage linearly drops with increases in temperature.

To the positive input terminal of the operational amplifier circuit 111, a voltage obtained by dividing the power-supply voltage of the temperature detection circuit 13 by the resistance elements 124 and 123 is inputted as an offset voltage.

It should be noted that it is also possible to replace the resistance element 106 connected between the source S3 of the P-channel MOS transistor 105 and the positive power line 103 with a digital control variable resistance circuit to form a complete unit, and then to control the drain current of the P-channel MOS transistor 105 by digital data stored in the memory circuit 19.

The memory circuit 19 shown in FIG. 1, whose storage and read of the digital data are controlled from the outside via the serial input/output line 18, outputs the digital data for control to the digital control variable resistance circuit 21 of the control voltage generation circuit 23 and to the digital control voltage division circuits 31 and 33 via the parallel output lines 14a to 14c.

As described above, the output voltage of the temperature detection circuit 13 linearly drops with increases in temperature, so that a voltage difference between the output voltage of the temperature detection circuit 13 and the voltage (0 V) of the ground power line 26 of the control voltage generation circuit 23 decreases.

This voltage difference is divided into a desired value by the digital control voltage division circuit 33 and inputted to the gate G2 of the N-channel MOS transistor 35 as a gate input voltage. When the temperature increases from a low level to reach a temperature T1 shown in FIG. 5 so that the gate input voltage becomes a threshold value voltage or lower of the N-channel MOS transistor 35, the electric current flowing between the source S2 and the drain D2 thereof is interrupted. A temperature range up to the temperature T1 is a first temperature area TA1, in which while the N-channel MOS transistor 35 is in an ON state, the P-channel MOS transistor 37 is in an OFF state.

On the other hand, as the temperature increases, the voltage difference between the output voltage of the temperature detection circuit 13 and the voltage of the positive power line 25 of the control voltage generation circuit 23 linearly increases, conversely.

This voltage difference is divided into a desired value by the digital control voltage division circuit 31 and inputted to the gate G1 of the p-channel MOS transistor 37 as a gate input voltage. When the temperature reaches a temperature T2 shown in FIG. 5 so that the gate input voltage exceeds a threshold value voltage of the P-channel MOS transistor 37, an electric current begins flowing between the source S1 and the drain D1 thereof.

The voltage division ratios of the digital control voltage division circuits 31 and 33 are set by the digital data stored in the memory circuit 19 so that the temperature T2 is higher than the temperature T1 and values of the temperature T1 and the temperature T2 are desired values.

The temperature T1 is set in the vicinity of a maximum point (−10 degrees to 0 degrees) on a low temperature side of an AT cut crystal resonator, and the temperature T2 is set in the vicinity of a minimum point (60 degrees to 70 degrees) on a high temperature side of the AT cut crystal resonator. A temperature range from the temperature T1 to the temperature T2 is a second temperature area TA2, in which both the P-channel MOS transistor 37 and the N-channel MOS transistor 35 are in the OFF states. Since, the AT cut crystal resonator substantially linearly varies in frequency in a temperature area between the aforesaid maximum and minimum points, temperature compensation is conducted to the oscillation frequency of the oscillation, circuit 47 only by a variation in the aforesaid second control voltage Vo2 in this second temperature area TA2.

Both resistance values of the first resistance element 39 and the second resistance element 43 are preferably set to be 100 kilohms (KΩ) or more. If the resistance values are lower than 100 KΩ, the electric current consumed by the control voltage generation circuit 23 increases as well as influence of the P-channel MOS transistor 37 and the N-channel MOS transistor 35 in the ON states exerted on their equivalent resistances can not be ignored. As a result, saturation of voltage is generated at points of the first control voltage Vo1 at the maximum temperature and the minimum temperature, so that a voltage curve generated at the drain connection point 44 deforms, i.e., it becomes impossible to obtain a desired voltage curve at which temperature characteristics of the AT cut crystal resonator can be sufficiently compensated.

Figure 5:
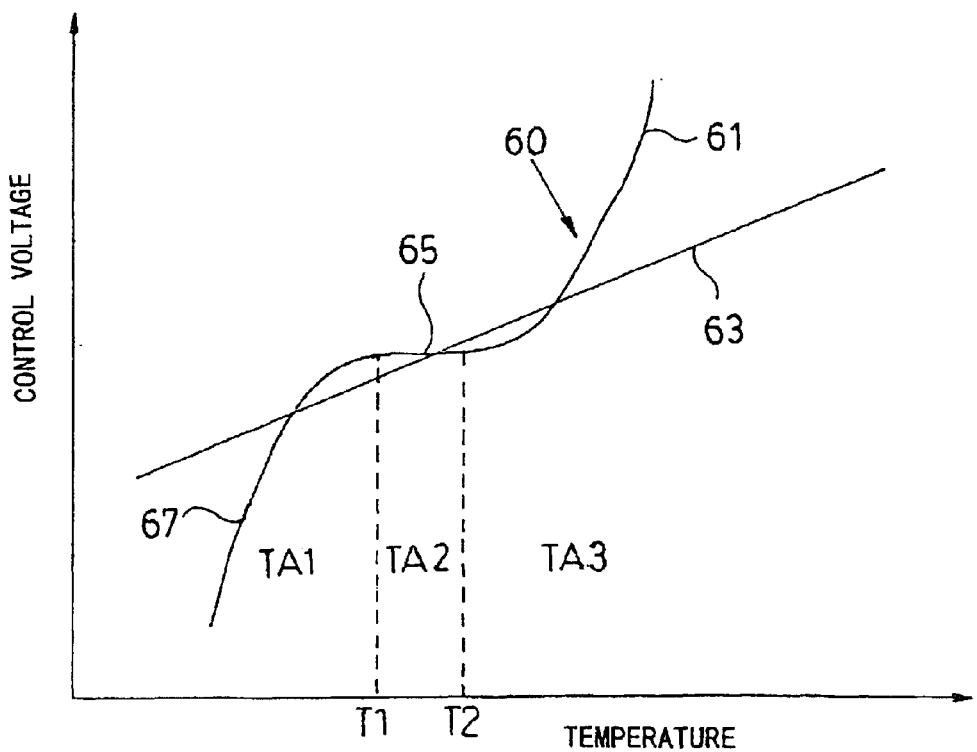
FIG. 5 is a diagram showing a relationship between temperature and first and second control voltages in the first embodiment of the invention.

Until the temperature reaches T1 (in the first temperature area TA1) in FIG. 5, the electric current flowing between the source S1 and the drain D1 of the P-channel MOS transistor 37 is interrupted, and thus the electric current flowing through the second resistance element 43 is very small as compared to the electric current flowing between the source S2 and the drain D2 of the N-channel MOS transistor 35. Therefore, the electric current flowing from the positive power line 25 of the control voltage generation circuit 23 into the first resistance element 39 is substantially equal to the electric current flowing between the source S2 and the drain D2 of the N-channel MOS transistor 35.

Since the first control voltage Vo1 generated at the connection point 44 between the drain D1 of the P-channel MOS transistor 37 and the drain D2 of the N-channel MOS transistor 35 is a voltage obtained by subtracting a voltage produced across the first resistance element 39 from the voltage of the positive power line 25 of the control voltage generation circuit 23, the changes in the first control voltage Vo1 with respect to temperatures present a curve projecting upward in accordance with the relation between the gate voltage and the drain current of the N-channel MOS transistor 35, that is, in conformity with a so-called square law.

In a part of the temperature between T1 and T2 in FIG. 5 which is the second temperature area TA2, since both the N-channel MOS transistor 35 and the P-channel MOS transistor 37 are in states of being interrupted and no electric current flows between the sources and the drains thereof, the first control voltage Vo1 generated at the connection point 44 is a value obtained by dividing the power-supply voltage by the power supply 11 by a resistance ratio between the first resistance element 39 and the second resistance element 43.

For example, if the resistance values of the first resistance element 39 and the second resistance element 43 are set equal, the value of the first control voltage Vo1 becomes half the value of the power supply voltage.

Further, when the temperature increases to exceed T2 in FIG. 5 into a third temperature area TA3, the P-channel MOS transistor 37 turns into the ON state while the N-channel MOS transistor 35 is kept in the interrupted state. Therefore, the electric current flowing through the first resistance element 39 becomes very small as compared to the electric current flowing between the source S1 and the drain D1 of the P-channel MOS transistor 37, and the electric current flowing into the ground power line 26 via the second resistance element 43 becomes substantially equal to the electric current flowing between the source S1 and the drain D1 of the P-channel MOS transistor 37.

Accordingly, since the first control voltage Vo1 generated at the drain connection point 44 is a voltage produced across the second resistance element 43, the changes in the first control voltage Vo1 with respect to temperatures present a curve projecting downward in accordance with the relation between the gate voltage and the drain current of the P-channel MOS transistor, that is, in conformity with the so-called square law.

Therefore, an appearance of changes in the first control voltage Vo1 generated at the drain connection point 44 with respect to changes in temperature becomes like a curved line 60 in a diagram shown in FIG. 5. In the drawing, temperature is plotted on the abscissa axis and the control voltage is plotted on the ordinate axis.

Of the curved line 60, a range below the temperature T1 (the first temperature area TA1) corresponds to a curved line part 67, a range from the temperature T1 to the temperature T2 (the second temperature area TA2) corresponds to a curved line part 65, and a range exceeding the temperature T2 (the third temperature area TA3) corresponds to a curved line part 61 to form a cubic term voltage. It should be noted that a linear line 63 shows a linear term voltage being the later-described second control voltage Vo2.

The changes in the first control voltage Vo1 are, as shown by the curved line 60, generated by the square law of the MOS transistor in principle, but they become a curved line being an approximate cubic curve which is continuous with respect to temperatures, and thus it is unnecessary to generate the voltage separately for the low temperature part and the high temperature part.

Hence, if the values of the temperature T1 and the temperature T2 are appropriately selected, an error to an actual cubic curve becomes 10 mV or lower, which makes it possible to sufficiently compensate cubic temperature characteristics of the AT cut crystal.

It should be noted that the digital control voltage division circuit 31 being the first gate voltage generation circuit shown in FIG. 1 changes the first gate voltage outputted to the gate G1 of the P-channel MOS transistor 37 linearly with respect to changes in temperature at least in the third temperature area TA3. Further, the digital control voltage division circuit 33 being the second gate voltage generation circuit changes the second gate voltage outputted to the gate G2 of the N-channel MOS transistor 35 linearly with respect to changes in temperature at least in the first temperature area TA1.

Furthermore, the third resistance element 22 in FIG. 1 exerts the same action as the action which has been explained on the resistance element 106 connected to the source S3 of the P-channel MOS transistor 105 shown in FIG. 2 of the temperature detection circuit 13, and presents an effect like a negative feedback of limiting the drain current of the P-channel MOS transistor 37. Accordingly, by adjusting the resistance value of the third resistance element 22, it becomes possible to control the rate of change in the voltage across the first resistance element 39 produced by the drain current of the P-channel MOS transistor 37 with respect to temperature. Thereby, if there are variation in properties of the MOS transistors 37 and 35, adjustment can be conducted so that an approximate error in compensating the cubic temperature characteristics of the AT cut crystal becomes smaller.

The fourth resistance element 20 also exerts the same action as that of the above-described third resistance element 22 on the drain current of the N-channel MOS transistor 35.

Further, it is also possible to replace the third resistance element 22 and the fourth resistance element 20 with digital control variable resistance circuits to form a complete unit, and then to perform the above-described adjustment by the digital data stored in the memory circuit 19. In this case, the resistance value of the third resistance element 22 is adjusted so that the oscillation frequency of the oscillation circuit 47 becomes a desired value at a maximum temperature for temperature compensation, and the resistance value of the fourth resistance element 20 is adjusted so that the oscillation frequency of the oscillation circuit 47 becomes a desired value at a minimum temperature for temperature compensation.

Temperature compensation can be conducted without using the resistance elements 20 and 22, but, in this case, the curve shape of the first control voltage Vo1 is determined only by the aforesaid temperatures T1 and T2, which makes it difficult to sufficiently absorb variations in temperature characteristics of individual crystal resonators.

While the example in which only one temperature detection circuit 13 is used and its output voltage is inputted to the digital control voltage division circuits 31 and 33 is explained in this embodiment, the same effect can be obtained also by inputting output voltages of different temperature detection circuits into the digital control voltage division circuits 31 and 33.

Next, explanation is made on the principle of operation of generating the second control voltage Vo2 by the control voltage generation circuit 23.

As the temperature changes from a low temperature to a high temperature, the output voltage of the temperature detection circuit 13 linearly drops as in the above explanation. Since the output voltage of the temperature detection circuit 13 is inputted to the negative input terminal of the operational amplifier circuit 29 via the resistance element 27, the operation of the operational amplifier circuit 29 becomes inverse amplification and its output voltage linearly increases with increases in temperature. Accordingly, the second control voltage Vo2 generated at the output terminal 28 of the operational amplifier circuit 29 linearly increases with increases in temperature.

A gradient of the linear change in this event depends on an amplification factor of the operational amplifier circuit 29, and the amplification factor of the operational amplifier circuit 29 is determined by a ratio between a resistance value of the digital control variable resistance circuit 21 inserted between the negative input terminal and the output terminal of the operational amplifier circuit 29 and a resistance value of the resistance element 27. Therefore, for changing the gradient of the second control voltage Vo2 with respect to changes in temperature, the resistance value of the digital control variable resistance circuit 21 should be changed by the digital data stored in the memory 19.

An appearance of changes in the second control voltage Vo2 generated at the output terminal 28 of the operational amplifier circuit 29 with respect to temperatures is the linear term voltage shown by the straight line 63 in the diagram shown in FIG. 5, in which temperature is plotted on the abscissa axis and the control voltage is plotted on the ordinate axis.

Next, an operation of adding the above-described first control voltage Vo1 and second control voltage Vo2 by the frequency adjustment circuit 45 is explained.

The first control voltage Vo1 is inputted to the gate electrode that is one of electrodes of the MIS variable capacitor 41 of the frequency adjustment circuit 45 via the resistance element 52 for preventing a high frequency current from flowing out as well as to the gate electrode of the MIS variable capacitor 54 similarly via the resistance element 53.

The second control voltage Vo2 is inputted to the substrate electrodes which are the respective other electrodes of the MIS variable capacitors 41 and 54 via the resistance element 59 for preventing a high frequency current from flowing out.

The capacitance elements 57 and 58 are inserted to interrupt a direct-current voltage on the inverter side of the oscillation circuit 47, and the capacitance element 55 is an element for interrupting only the direct current to ground the MIS variable capacitors 41 and 54 in a high frequency range.

Since the first control voltage Vo1 is inputted to the gate electrodes of the MIS variable capacitors 41 and 54 and the second control voltage Vo2 is inputted to the substrate electrodes thereof as described above, the voltage applied to the MIS variable capacitors 41 and 54 is a voltage obtained by subtracting the second control voltage Vo2 from the first control voltage Vo1. Therefore, since the gradient of the second control voltage Vo2 has an effect in the opposite manner to the first control voltage Vo1, the straight line 63 of the second control voltage Vo2 having a positive gradient shown in FIG. 5 acts as a negative gradient on the curved line 60 of the first control voltage Vo1.

An appearance of changes in difference between the voltages applied to both electrodes of the MIS variable capacitors 41 and 54 (the first control voltage Vo1—the second control voltage Vo2) with respect to temperatures becomes like a curved line 71 shown in a diagram in FIG.

6, in which temperature is plotted on the abscissa axis and the control voltage is plotted on the ordinate axis. As is clear also from its shape, the curved line 71 is a curved line approximate to a curved line obtained by adding a linear line with a negative gradient to a cubic line.

As described above, it is possible to easily add the first control voltage Vo1 which approximates a cubic curve with respect to temperatures and the second control voltage Vo2 having a linear gradient with respect to temperatures without requiring a specific adding circuit.

Next, the principle of operation of adjusting the offset voltage is explained.

The output of the operational amplifier circuit 147 shown in FIG. 3 of the external control voltage input circuit 17 in FIG. 1 is inputted as the offset voltage to the positive input terminal of the operational amplifier circuit 29 of the control voltage generation circuit 23. Since the output voltage of the operational amplifier circuit 29 changes in accordance with the offset input voltage, the output voltage of the operational amplifier circuit 29 changes in accordance with the output voltage of the operational amplifier circuit 147.

Since the output voltage of the operational amplifier circuit 29 is the second control voltage Vo2, as a result, the second control voltage Vo2 changes in accordance with the output voltage of the operational amplifier circuit 147.

The output voltage of the operational amplifier circuit 147 changes in accordance with both of the input voltage to the negative input terminal thereof and the input voltage to the positive input terminal thereof (the offset voltage). In other words, the output voltage of the operational amplifier circuit 147 changes in accordance with both of the output voltage of the operational amplifier circuit 137 and the divided voltage output of the digital control voltage division circuit 139.

The output voltage of the operational amplifier circuit 137 also changes in accordance with both of the input voltage to the negative input terminal thereof and the input voltage to the positive input terminal (the offset input voltage). However, since the offset input voltage is a fixed voltage obtained by dividing the power-supply voltage by the power supply 130 by the resistance elements 133 and 135, the output voltage of the operational amplifier circuit 137 changes depending only on the external input voltage from the input terminal 12. The offset input voltage of the operational amplifier circuit 137 serves a function of adding an offset to the output voltage of the operational amplifier circuit 137 which changes by the external input voltage.

As a result, the second control voltage Vo2 changes due to both of the external input voltage from the input terminal 12 and the divided voltage output of the digital control voltage division circuit 139.

Hence, it is possible to adjust a standard oscillation frequency of the temperature compensated oscillator in fabrication by controlling the divided voltage output of the digital control voltage division circuit 139 by the digital data stored in the memory circuit 19 to change the second control voltage Vo2.

When using the temperature compensated oscillator, a customer inputs an external input voltage called an AFC input voltage into the input terminal 12 to adjust the oscillation frequency of the temperature compensated oscillator to a desired value. In this event, it is possible to set the compression rate of the variation range of the external input voltage by controlling the resistance value of the digital control variable resistance circuit 141 by the digital data stored in the memory circuit 19 to change the amplification factor of the operational amplifier circuit 137.

The external input voltage inputted to the input terminal 12 of the external control voltage input circuit 17 shown in FIG. 3 is inversely amplified twice in two operational amplifier circuits, that is, the operational amplifier circuits 137 and 147, so that the external input voltage, the output voltage of the operational amplifier circuit 147, and the second control voltage Vo2 change in the same direction.

When the directions of the changes in the external input voltage and the second control voltage Vo2 are made opposite to each other, the number of operational amplifier circuits constituting the external control voltage input circuit 17 should be odd numbers. Whether the number of operational amplifier circuits is set to be even numbers or odd numbers is decided at the time of adjusting the directions of the change in the external input voltage and the change in the oscillation frequency to be the same or opposite.

Next, the principle of operation of the frequency adjustment circuit 45 is explained.

The MIS variable capacitors 41 and 54 constituting the frequency adjustment circuit 45 function as a load capacitance of the crystal resonator constituting the oscillation circuit 47, and thus when capacitance values of the MIS variable capacitors 41 and 54 change, the oscillation frequency changes.

Since the MIS variable capacitors 41 and 54 change in capacitance value depending on the difference between the control voltages applied to both electrodes thereof, as a result, the oscillation frequency of the oscillation circuit 47 can be controlled by the difference between the voltages applied to both electrodes of the MIS variable capacitors 41 and 54.

Figure 7:
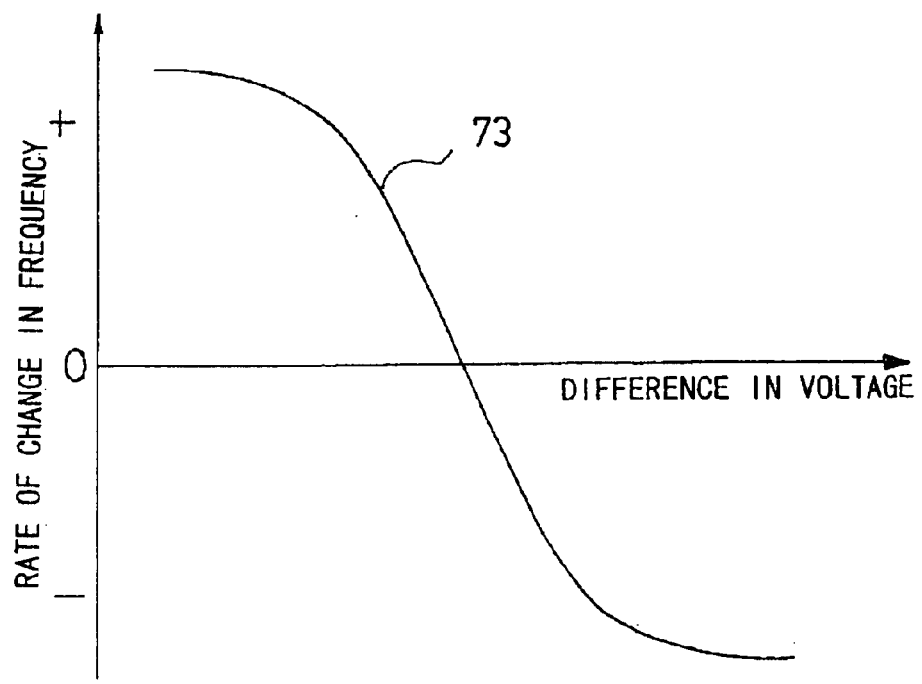
FIG. 7 is a diagram showing a relationship between the difference in voltage and a rate of change in frequency of the same.

An appearance of changes in difference between the voltages applied to both electrodes of the MIS variable capacitors 41 and 54 and changes in the oscillation frequency becomes like a curved line 73 shown in a diagram in FIG. 7, in which the difference between the voltages is plotted on the abscissa axis and the rate of change in frequency is plotted on the ordinate axis. As is clear from this drawing, with respect to increases in the positive direction of the difference between the voltages applied to both electrodes of the MIS variable capacitors 41 and 54, the oscillation frequency decreases and the sign of the rate of change in the oscillation frequency changes from the positive sign to the negative sign.

It should be noted that while the changes appear in the aforementioned direction since a case in which the MIS variable capacitors 41 and 54 are provided on an N-type silicon substrate is taken as an example in this embodiment, the changes appear in an opposite direction thereto when the MIS variable capacitors 41 and 54 are provided on a P-type silicon substrate.

Specifically, with respect to increases in the positive direction of the difference between the voltages applied to both electrodes of the MIS variable capacitors 41 and 54, the oscillation frequency increases and the sign of the rate of change in the oscillation frequency changes from the negative sign to the positive sign.

As described in the explanation on the relation between the external input voltage inputted to the input terminal 12, the output voltage of the operational amplifier circuit 147, and the second control voltage Vo2 in FIG. 3, the external input voltage, the output voltage of the operational amplifier circuit 147, and the second control voltage Vo2 change in the same direction. Further, since their increases in voltage act on the MIS variable capacitors 41 and 54 in a direction to decrease the difference between the voltages applied to both electrodes thereof, the external input voltage and the oscillation frequency of the temperature compensated oscillator proportionally change.

A middle part of the curved line 73 shown in FIG. 7 is a substantially straight line, and thus when the adjustment of the frequency is conducted with a difference in this range, the difference between the voltages applied to both electrodes of the MIS variable capacitors 41 and 54 and the rate of change in the oscillation frequency have a substantially linear relationship.

Figure 6:
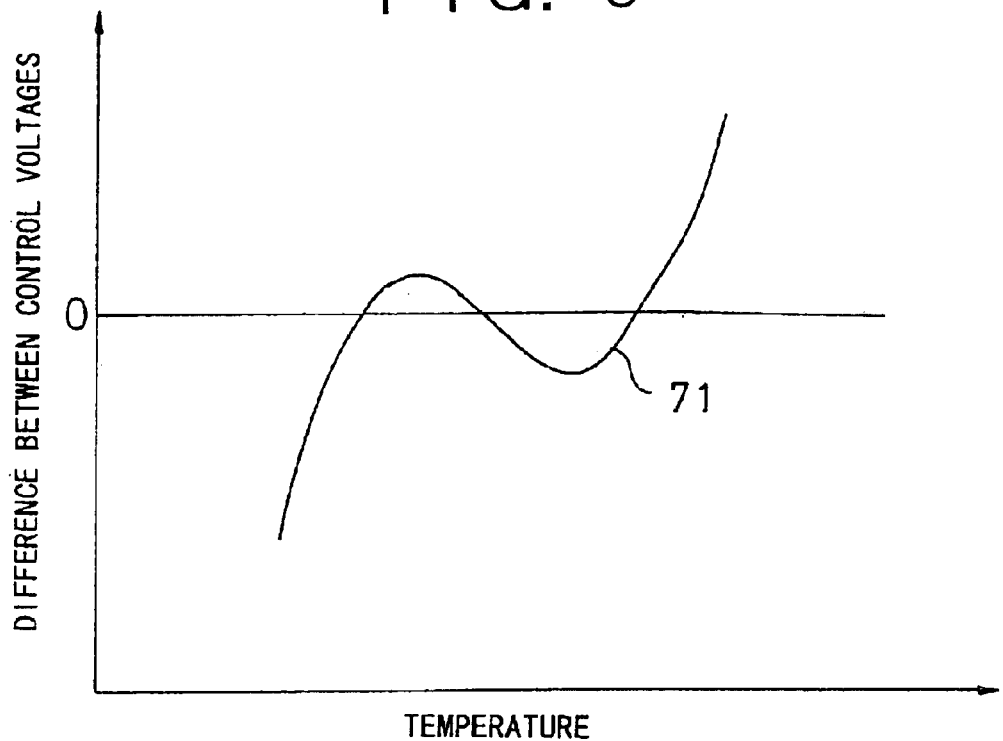
FIG. 6 is a diagram showing a relationship between temperature and a difference between the first control voltage and the second control voltage of the same.
Figure 8:
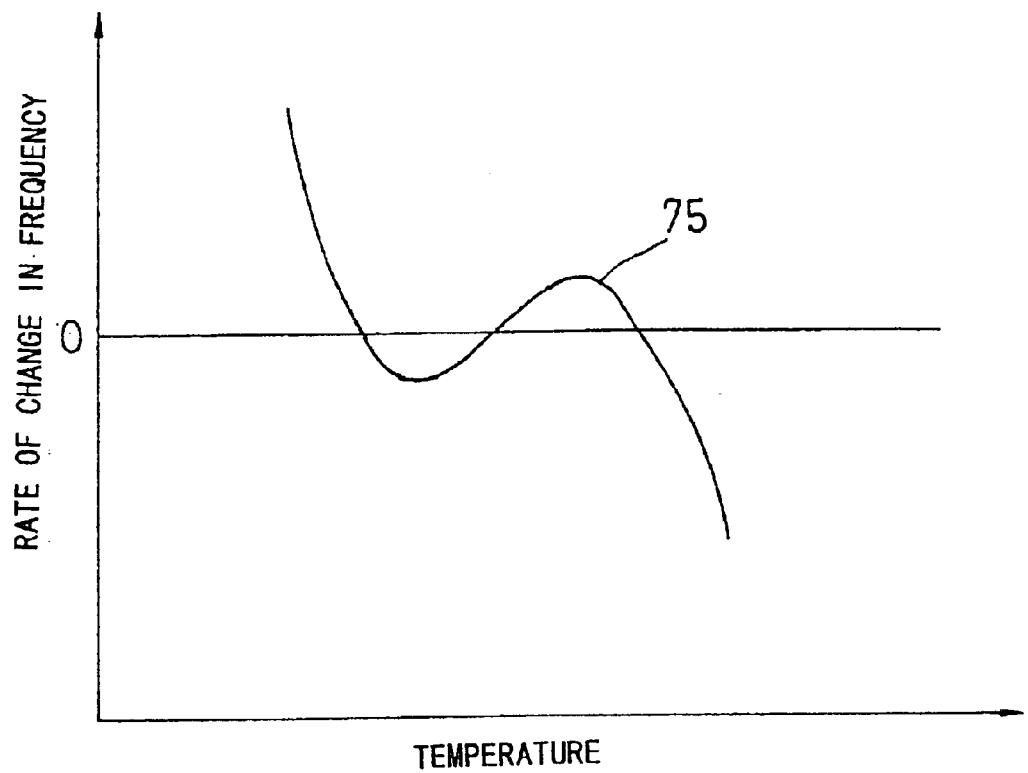
FIG. 8 is a diagram showing a relationship between temperature and a rate of change in frequency of the same.

Therefore, when differences between the voltages shown by the curved line 71 in FIG. 6 are applied with respect to temperatures, an appearance of the rates of change in the frequency with respect to the temperatures becomes like a curved line 75 in a diagram shown in FIG. 8, in which temperature is plotted on the abscissa axis and the rate of change in frequency is plotted on the ordinate axis.

The shape of the curved line is opposite, with respect to a temperature axis, to that of characteristics of the frequency change rates with respect to temperatures of the AT cut crystal resonator, so that the temperature characteristics of the AT cut crystal resonator can be compensated.

Modification of the First Embodiment: FIG. 9 to FIG. 14

An embodiment in which a part of the above-described first embodiment is modified is explained here.

While the temperature detection circuit 13 in which the P-channel MOS transistor is used, and temperature and the output voltage are in an inversely proportional relationship is used in the first embodiment, the same effect can be obtained even if an N-channel MOS transistor is used.

Figure 9:
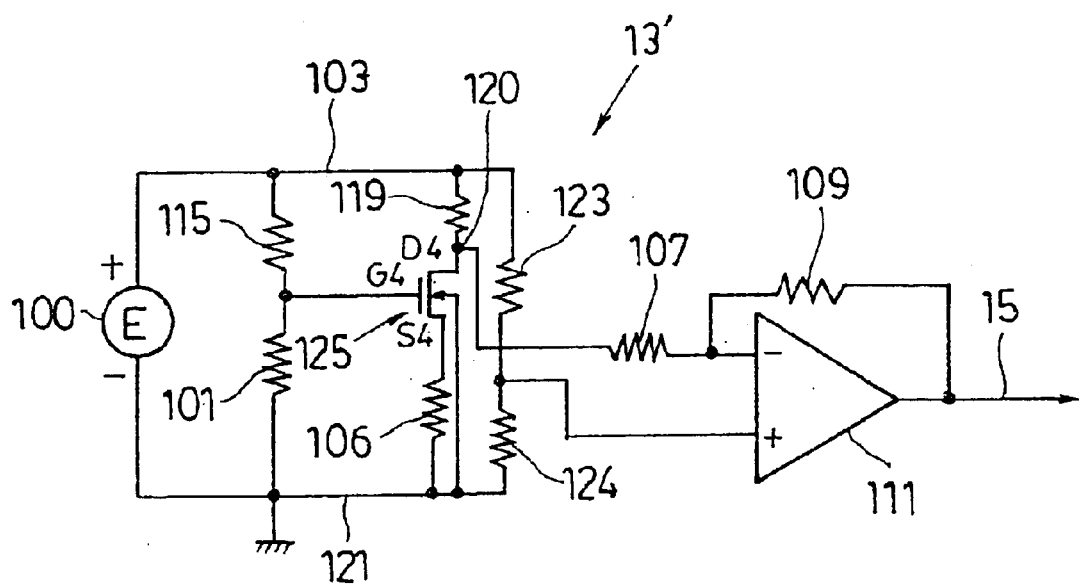
FIG. 9 is a circuit diagram showing another configuration example of a temperature detection circuit used in the invention.

For example, a circuit example of the above is shown in FIG. 9. A temperature detection circuit 13' has the same circuit configuration as that of the temperature detection circuit 13 shown in FIG. 2 except that an N-channel MOS transistor 125 is used in place of the P-channel MOS transistor 105, and thus elements corresponding to those in FIG. 2 are assigned the same numerals and symbols.

In the temperature detection circuit 13', a gate G4 of the N-channel MOS transistor 125 is connected to the connection point between the resistance elements 115 and 101 which are connected in series between the positive power line 103 and the ground power line 121 of the power supply 100. A source S4 is connected to the ground power line 121 via the resistance element 106, and a drain D4 is connected to the positive power line 103 via the resistance element 119, so that the output voltage at a connection point 120 between the resistance, element 119 and the drain D4 of the N-channel MOS transistor 125 is inputted to the negative input terminal of the operational amplifier circuit 111 via the resistance element 107. The other configuration and operation are the same as those of the temperature detection circuit 13 shown in FIG. 2, and thus the description thereof is omitted. Moreover, the output voltage of the operational amplifier circuit 111 is an output of the temperature detection circuit 13', and temperature and the output voltage are in a proportional relationship.

Figure 10:
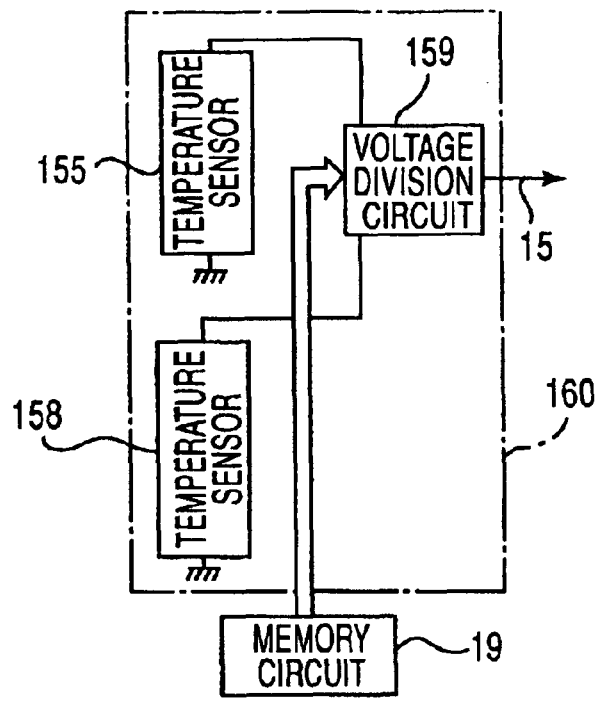
FIG. 10 is a block circuit diagram showing still another configuration example of a temperature detection circuit of the same.

Further, instead of generating the second control voltage Vo2 by the temperature detection circuit 13 and the operational amplifier circuit 29 in FIG. 1, it is possible to use, as shown in FIG. 10, a temperature detection circuit 160 having two temperature sensors 155 and 158 which are different in temperature gradient.

The temperature detection circuit 160 divides a difference between output voltages of the two temperature sensors 155 and 158 by a voltage division circuit 159 into an arbitrary ratio, so as to make it possible to select an arbitrary temperature gradient between the temperature gradients of the two temperature sensors 155 and 158. An output voltage of the voltage division circuit 159 is used as the second control voltage Vo2. The division ratio by the voltage division circuit 159 can be changed by the digital signal from the memory circuit 19.

Figure 11:
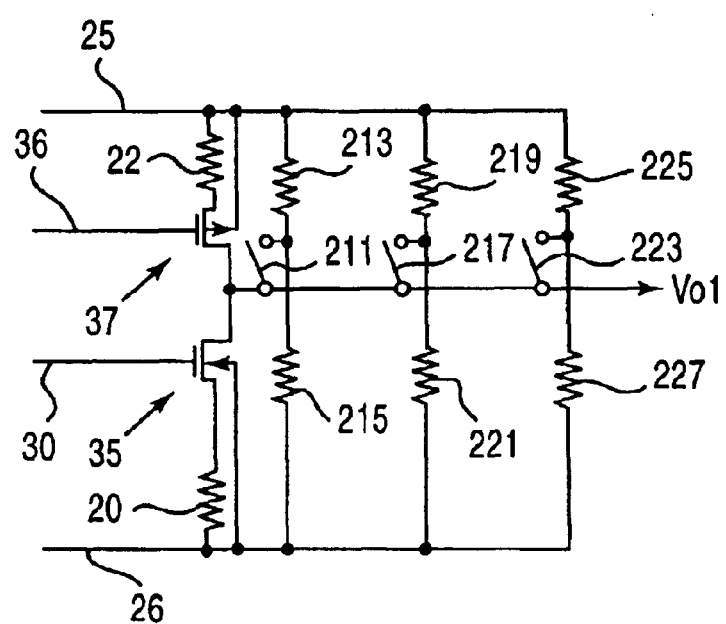
FIG. 11 is a circuit diagram showing another configuration example of a circuit for generating the first control voltage in FIG. 1.

Further, even if a resistance element 213 and a resistance element 215 which are different in temperature coefficient with respect to resistance value as shown in FIG. 11 are used in place of the first resistance element 39 and the second resistance element 43 in FIG. 1, the same effect can be obtained.

In other words, since the first control voltage Vo1 is a value obtained by dividing the power-supply voltage of the control voltage generation circuit 23 by the resistance element 213 and the resistance element 215 in the above-described second temperature area (the temperature area TA2 in FIG. 5), the first control voltage Vo1 linearly changes with respect to changes in temperature when the resistance element 213 and the resistance element 215 are different in temperature coefficient with respect to resistance value. In this event, for changing the temperature gradient, what is required is to prepare a plurality of pairs, each pair being constituted by two resistance elements, having different combinations of temperature coefficients with respect to resistance values, and to switch therebetween by switches.

In the example shown in FIG. 11, any pair of three pairs of resistance elements 213 and 215, 219 and 221, and 225 and 227 which have different combinations of temperature coefficients with respect to resistance values is selectively switched for use by turning on/off three switches 211, 217 and 223 which are switching means. It is also possible to conduct ON/OFF controls of these switches 211, 217 and 223 by the digital signal from the memory circuit.

Figure 12:
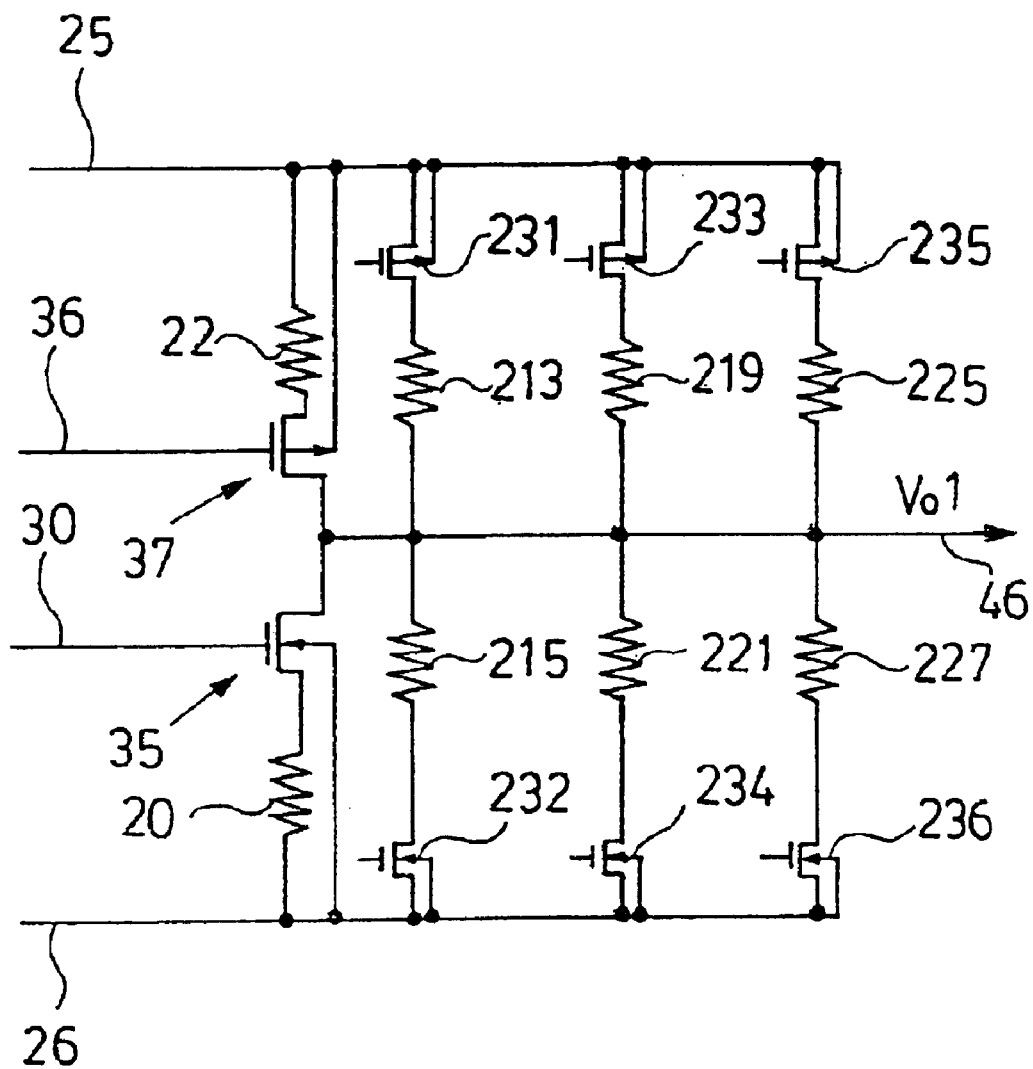
FIG. 12 is a circuit diagram showing still another configuration example of a circuit for generating the first control voltage of the same.

When switching transistors are, used in place of the switches 211, 217 and 223, it is preferable to insert switching transistors 231, 233 and 235 between the positive power line 25 and the resistance elements 213, 219 and 225, respectively, and to insert switching transistors 232, 234 and 236 between the ground power line 26 and the resistance elements 215, 221 and 227, respectively as shown in FIG. 12. This makes it possible to decrease ON resistances of the switching transistors.

Furthermore, in this case, a control voltage for each of the switching transistors 231 to 236 is supplied from a regulator circuit, which makes it possible to prevent the ON resistances of the switching transistors from varying due to a variation in the power-supply voltage.

Figure 13:
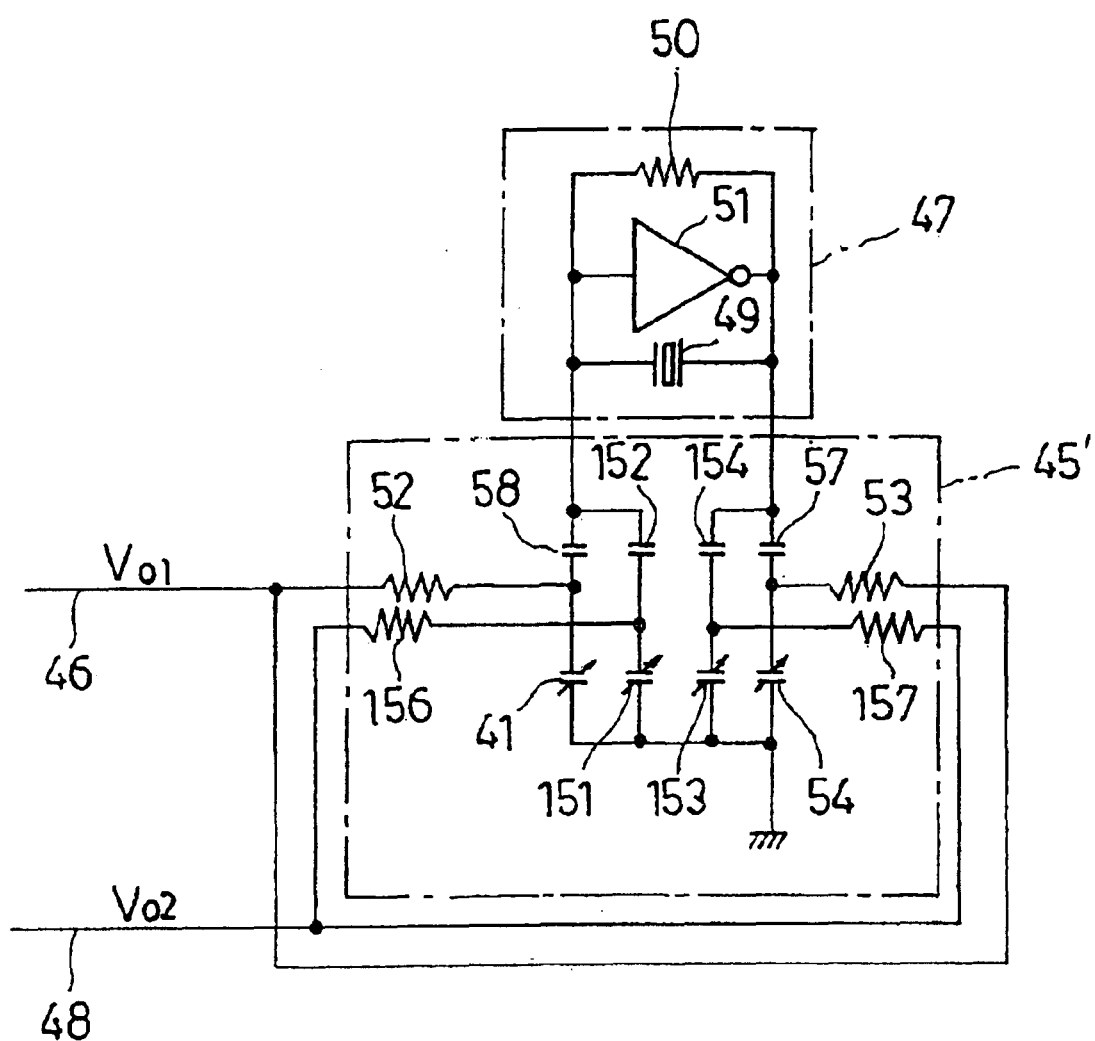
FIG. 13 is a circuit diagram showing the oscillation circuit shown in FIG. 1 and a partially modified frequency adjustment circuit.

Furthermore, it is also adoptable to use a frequency adjustment circuit 45' shown in FIG. 13 in place of the frequency adjustment circuit 45 shown in FIG. 1. In FIG. 13, the same portions as those of the frequency adjustment circuit 45 in FIG. 1 are assigned the same numerals and symbols.

In the frequency adjustment circuit 45', series circuits composed of second MIS variable capacitors 151 and 153 with respective capacitance elements 152 and 154 are provided in parallel to series circuits composed of the MIS variable capacitors 41 and 54 with the respective capacitance elements 58 and 57, respectively.

In this case, the first control voltage Vo1 is applied to each of the gate electrodes of the MIS variable capacitors 41 and 54 via the signal line 46 and the resistance element 52 or 53 as in the first embodiment shown in FIG. 1, but the second control voltage Vo2 is applied to each of gate electrodes of the second MIS variable capacitors 151 and 153 via the signal line 48 and a resistance element 156 or 157. Also in this arrangement, the same result as in the above-described first embodiment can be obtained.

Figure 14:
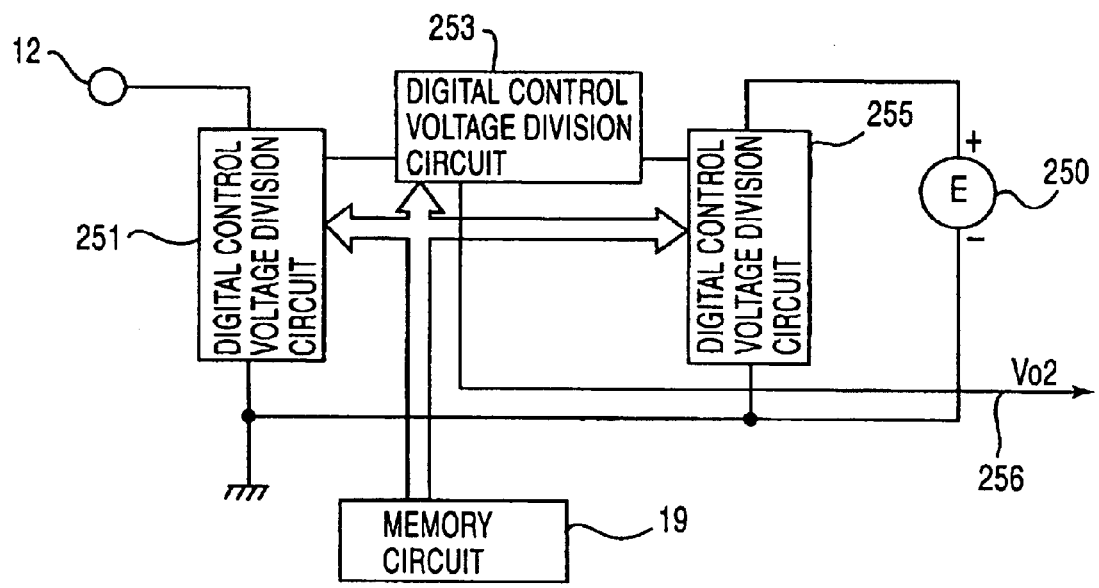
FIG. 14 is a block circuit diagram showing another example of an external control voltage input circuit used in the invention.

Furthermore, as for the adjustment of the standard oscillation frequency of the temperature compensated oscillator in fabrication and the adjustment of the frequency of the temperature compensated oscillator by the external input voltage called an AFC input voltage, the same effects can be obtained also by a kind of resister network as shown in FIG. 14.

In FIG. 14, a digital control voltage division circuit 251 which is controlled by the digital signal from the memory circuit 19 divides the external input voltage from the input terminal 12 and applies it to one of terminals of a digital control voltage division circuit 253 which is controlled by the digital signal from the memory circuit 19. Further, a digital control voltage division circuit 255 which is controlled by the digital signal from the memory circuit 19 divides an output voltage of a constant-voltage source 250 and applies it to the other terminal of the digital control voltage division circuit 253.

Then, a divided voltage outputted to an output line 256 of the digital control voltage division circuit 253 is used as the second control voltage Vo2, and the voltage changes due to both of the external input voltage from the input terminal 12 and the divided voltage from the digital control voltage division circuit 255. Moreover, the output of the divided voltage changes in dependency on the external input voltage from the input terminal 12 and the divided voltage from the digital control voltage division circuit 255 in accordance with the division ratio of the digital control voltage division circuit 253.

Figure 16:
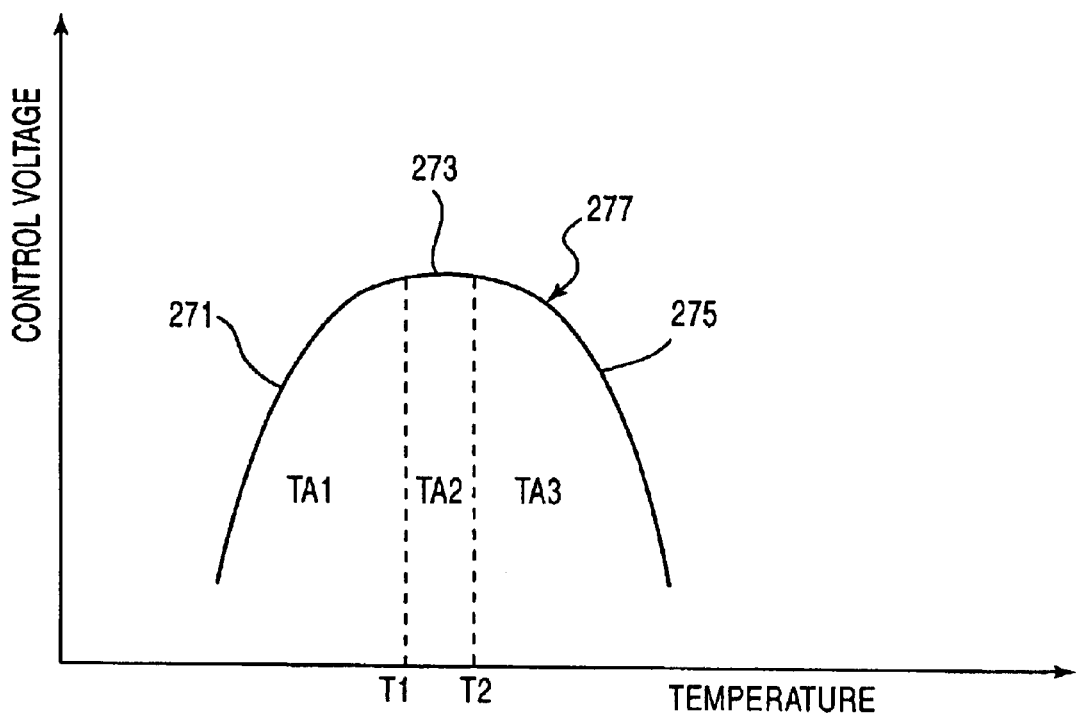
FIG. 16 is a diagram showing a relationship between temperature and a first control voltage generated by a control voltage generation circuit of the same.
Figure 15:
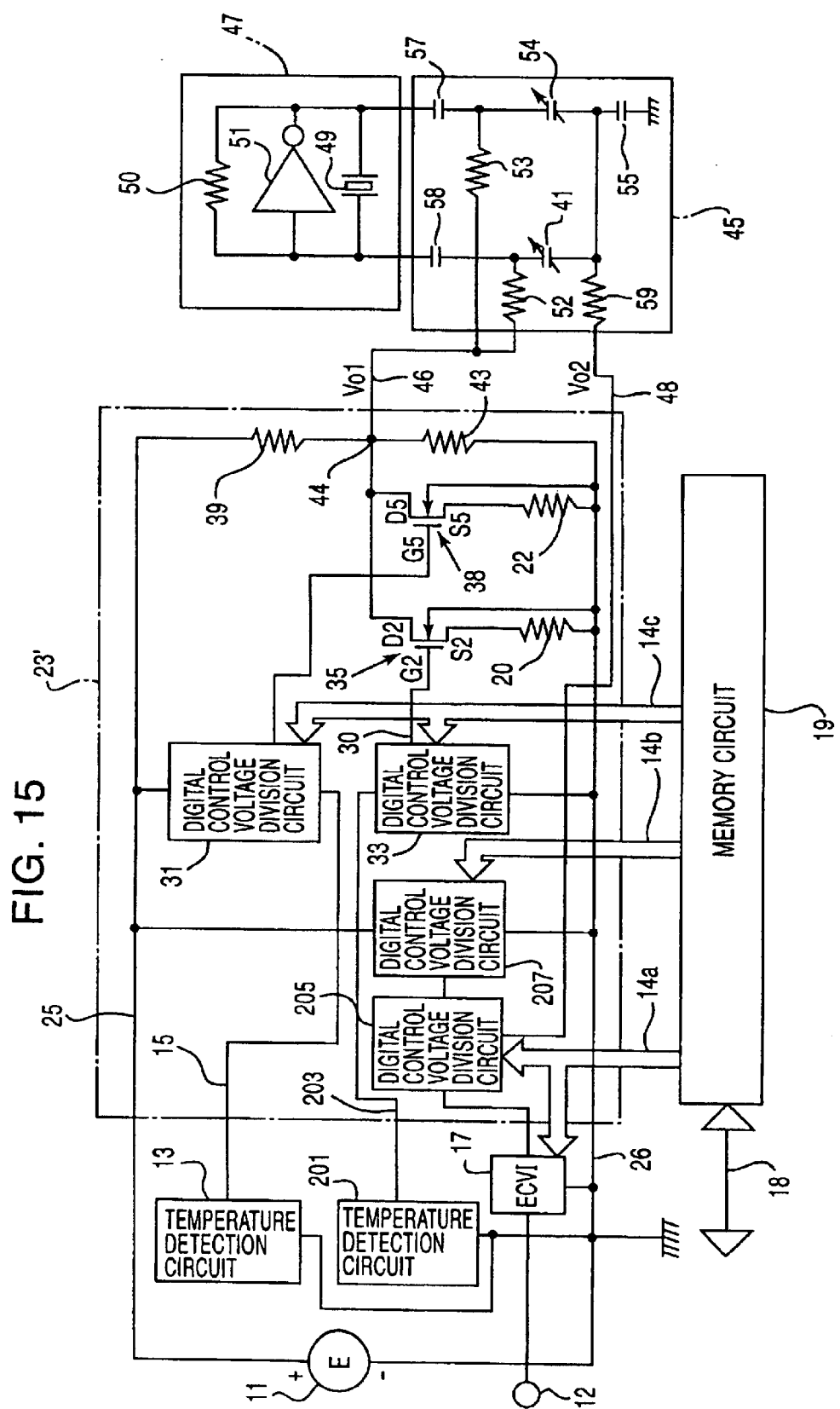
FIG. 15 is a block circuit diagram showing a second embodiment of a temperature compensated oscillator according to the invention.
Figure 17:
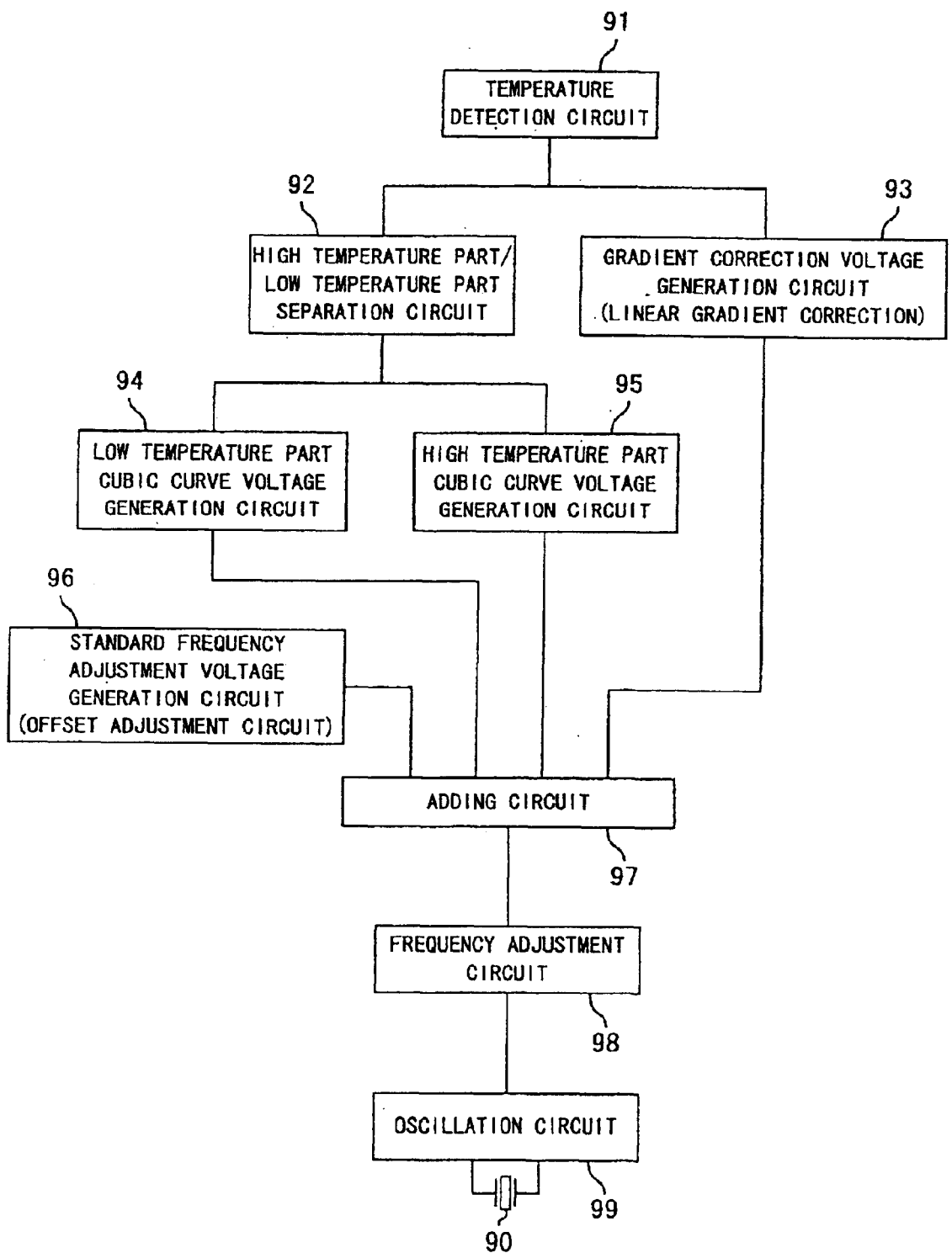
FIG. 17 is a block diagram showing a configuration example of a conventional temperature compensated oscillator.

Second Embodiment: FIG. 15 and FIG. 16

Next, the second embodiment of a temperature compensated oscillator according to the present invention is explained with reference to FIG. 15, FIG. 16, and the like.

FIG. 15 is a block circuit diagram showing a configuration of the temperature compensated oscillator, in which elements corresponding to those in the first embodiment shown in FIG. 1 are assigned the same numerals and symbols, the description thereof is omitted, or simplified.

Components of the temperature compensated oscillator shown in FIG. 15 is substantially the same as the components in FIG. 1 except that a temperature detection circuit 201 is newly added and that digital control voltage division circuits 205 and 207 are provided in place of the operational amplifier circuit 29, the resistance element 27, and the digital control variable resistance circuit 21 in FIG. 1.

A control voltage generation circuit 23' has the same circuit configuration as that of the control voltage generation circuit 23 shown in FIG. 1 except that the P-channel MOS transistor 37 in FIG. 1 is replaced with an N-channel MOS transistor 38, that both terminals of a digital control voltage division circuit 33 are connected to an output voltage line 203 of the newly provided temperature detection circuit 201 and to a ground power line 26 of the control voltage generation circuit 23', respectively, and that the digital control voltage division circuits 205 and 207 which serve the same operation as that of the operational amplifier circuit 29 are provided in place of the operational amplifier circuit 29 and the like as described above.

Circuit configurations and functions of a frequency adjustment circuit 45 and an oscillation circuit 47 are the same as those in the first embodiment, and thus the description thereof is omitted.

A circuit configuration and a function of a temperature detection circuit 13 are the same as those of the temperature detection circuit 13 shown in FIG. 2 in the first embodiment.

The temperature detection circuit 201 is constituted by an N-channel MOS transistor 125, resistance elements 119 and 106, an operational amplifier circuit 111, and the like similarly to the temperature detection circuit 13' shown in FIG. 9.

A circuit configuration and a function of an external control voltage input circuit 17 are the same as those of the external control voltage input circuit 17 shown in FIG. 3 in the first embodiment, and thus the description thereof is omitted. A configuration of a memory circuit 19 is the same as in the first embodiment.

In the control voltage generation circuit 23', connection of a digital control voltage division circuit 31 is completely the same as in the first embodiment shown in FIG. 1, and thus the description thereof is omitted. Both terminals of a digital control voltage division circuit 33 are connected to the output voltage line 203 of the temperature detection circuit 201 and the ground power line 26 of the control voltage generation circuit 23' as described above.

A divided voltage output of the digital control voltage division circuit 31 is inputted to a gate G5 of the N-channel MOS transistor 38 as a gate voltage, and a divided voltage output of the digital control voltage division circuit 33 is inputted to a gate G2 of an N-channel MOS transistor 35 as a gate voltage.

Also in this embodiment, the digital control voltage division circuit 31 constitutes a first gate voltage generation circuit, and the digital control voltage division circuit 33 constitutes a second gate voltage generation circuit.

A source S5 of the N-channel MOS transistor 38 is connected to the ground power line 26 via a third resistance element 22, and a source S2 of the N-channel MOS transistor 35 is connected to the ground power line 26 via a fourth resistance element 20.

Drains D2 and D5 of the N-channel MOS transistors 35 and 38 are commonly connected, and a drain connection point 44 therebetween is connected to a positive power line 25 via a first resistance element 39 and also to the ground power line 26 via a second resistance element 43.

In this embodiment, the N-channel MOS transistor 38 constituting a first MOS transistor, the N-channel MOS transistor 35 constituting a second MOS transistor, and the digital control voltage division circuits 31 and 33 constitute a quadratic term voltage generation circuit. Further, in this embodiment, the ground power line 26 is a first power line, which differs from the case of the first embodiment shown in FIG. 1. Moreover, while the sources of both the transistors 38 and 35 are connected to the ground power line 26 being the first power line, one of them may be connected to another power line (a second power line) if it is a power line having the same polarity.

A first control voltage Vo1 outputted from the drain connection point 44 of the control voltage generation circuit 23' and a second control voltage Vo2 composed of a divided voltage outputted from the digital control voltage division circuit 205 are inputted to the frequency adjustment circuit 45 via the signal lines 46 and 48, respectively.

Next, the operation of the temperature compensated oscillator of the second embodiment is explained.

In FIG. 15, the temperature detection circuit 13 detects a temperature of the oscillation circuit 47 and outputs a voltage dependent on the temperature to the control voltage generation circuit 23'. The temperature detection circuit 201 also detects the temperature of the oscillation circuit 47 and outputs a voltage dependent on the temperature to the control voltage generation circuit 23'.

First of all, explanation is made on the principle of operation of generating the first control voltage Vo1.

The operation of the temperature detection circuit 13 is the same as in the first embodiment, and thus the description thereof is omitted.

The temperature detection circuit 201 is configured in the same manner as the temperature detection circuit 13' shown in FIG. 9, in which a voltage, which is obtained by dividing the power-supply voltage by the power supply 100 by the resistance elements 115 and 101, is inputted to the gate G4 of the N-channel MOS transistor 125 in order to pass an electric current through the drain D4. As the temperature changes from a low temperature to a high temperature, the electric current through the drain D4 of the N-channel MOS transistor 125 increases and the voltage at the connection point 120 between the resistance element 119 and the drain D4 of the N-channel MOS transistor 125 linearly drops.

Since the voltage at the connection point 120 is inputted to the negative input terminal of the operational amplifier circuit 111 via the resistance element 107, the operation of the operational amplifier circuit 111 becomes inverse amplification and its output voltage linearly increases with increases in temperature. In short, temperature and the output voltage are in a proportional relationship.

To the positive input terminal of the operational amplifier circuit 111, a voltage obtained by dividing the power-supply voltage by resistance elements 123 and 124 is inputted as an offset voltage.

It is also possible to replace the resistance element 106 with a digital control variable resistance circuit to form a complete unit, and then to control the drain current of the N-channel MOS transistor 125 by digital data stored in the memory circuit 19.

The operation of the memory circuit 19 is the same as in the first embodiment, and thus the description thereof is omitted.

As described above, the output voltage of the temperature detection circuit 13 shown in FIG. 15 linearly drops with increases in temperature, and the output voltage of the temperature detection circuit 201 linearly increases with increases in temperature.

The basic principles of operations of the N-channel MOS transistor 35 and the N-channel MOS transistor 38 with respect to changes in temperature are the same as those explained in the first embodiment, and thus explanation thereof is made using temperature area partitions of a first temperature area, a second temperature area, and a third temperature area which are sequentially partition temperature areas from a lower temperature side as described in the first embodiment.

The N-channel MOS transistor 35 is ON and the N-channel MOS transistor 38 is OFF in the first temperature area at the low temperature side, both the N-channel MOS transistors 35 and 38 are OFF in the second temperature area at the intermediate, and the N-channel MOS transistor 35 is OFF and the N-channel MOS transistor 38 is ON in the third temperature area at the high temperature side.

An appearance of changes in the first control voltage Vo1 generated at the drain connection point 44 with respect to temperatures at that time becomes like a curved line 277 in a diagram shown in FIG. 16, in which temperature is plotted on the abscissa axis and the control voltage is plotted on the ordinate axis.

Of the curved line 277, a range below a temperature T1 (a first temperature area TA1) corresponds to a curved line part 271, a range from the temperature T1 to a temperature T2 (a second temperature area TA2) corresponds to a curved line part 273, and a range exceeding the temperature T2 (a third temperature area TA3) corresponds to a curved line part 275 to form a quadratic term voltage.

Since the changes in the first control voltage Vo1 are, as shown by the curved line 277, generated by the square law of the MOS transistor in principle, they become a quadratic curve with respect to temperatures, and thus it is unnecessary to generate the voltage separately for the low temperature part and the high temperature part.

If the values of the temperature T1 and the temperature T2 are appropriately selected, it is possible to accurately compensate quadratic temperature characteristics of a fork resonator.

Also in this case, the digital control voltage division circuit 31 being the first gate voltage generation circuit shown in FIG. 15 changes the first gate voltage outputted to the gate G5 of the N-channel MOS transistor 38 linearly with respect to the changes in temperature at least in the third temperature area TA3. Further, the digital control voltage division circuit 33 being the second gate voltage generation circuit changes the second gate voltage outputted to the gate G2 of the N-channel MOS transistor 35 linearly with respect to the changes in temperature at least in the first temperature area TA1.

The operations of the third resistance element 22 and the fourth resistance element 20 are completely the same as those in the first embodiment, and thus the description thereof is omitted.

Since the quadratic temperature characteristics of the fork resonator are compensated in the second embodiment, it is unnecessary to add a temperature gradient to the second control voltage Vo2 in order to correct the gradient of the cubic temperature characteristics of the AT cut crystal as explained in the first embodiment.

The principle of operation of adjusting the offset voltage and the principle of operation of the frequency adjustment circuit 45 are the same as those in the first embodiment, and thus the description thereof is omitted.

INDUSTRIAL APPLICABILITY

As has been described, a temperature compensated oscillator according to the invention can generate a control voltage in the shape of a sequential approximate cubic curve only by electric characteristics, of a P-channel MOS transistor and an N-channel MOS transistor without requiring circuits which are complex and difficult to adjust such as a high temperature part/low temperature part separation circuit, and a low temperature part cubic curve voltage generation circuit and a high temperature part cubic curve voltage generation circuit.

Further, the approximate cubic curve and a linear line which corrects a gradient can be added without using an adding circuit, which greatly simplifies the circuit configuration and facilitates integration of the temperature compensated oscillator to a semiconductor integrated circuit and can greatly reduce an area of a semiconductor integrated circuit chip, resulting in great effect on improvement of yields and reduction in cost.

Furthermore, the present invention presents the same effect also on a temperature compensated oscillator having temperature characteristics of a quadratic curve as in the compensation of a cubic curve.

What is claimed is:

1. A temperature compensated oscillator, comprising:
    an oscillation circuit;
    a frequency adjustment circuit for changing an oscillation frequency of said oscillation circuit by a control voltage;
    a temperature detection circuit for detecting a temperature in a vicinity of said oscillation circuit and generating at least one output voltage based on the detected temperature; and a control voltage generation circuit including a cubic term voltage generation circuit for generating a cubic term voltage as said control voltage based on the output voltage from said temperature detection circuit, wherein said cubic term voltage generation circuit includes a first circuit which generates a voltage curve projecting upward by a first square law and a second circuit which generates a voltage curve projecting downward by a second square law, each depending on an input voltage based on the output voltage from said temperature detection circuit respectively.

2. The temperature compensated oscillator according to claim 1,
wherein said cubic term voltage generation circuit is a circuit which generates the cubic term voltage by connecting the voltage curve projecting upward generated by said first circuit and the voltage curve projection downward generated by said second circuit, under control of said first circuit and said second circuit.

3. The temperature compensated oscillator according to claim 2,
wherein said first circuit includes a first MOS transistor having a source connected to a first power line,
wherein said second circuit includes a second MOS transistor having a conduction type different from that of said first MOS transistor and a source connected to a second power line, and
wherein said cubic term voltage generation circuit further comprises:
a first gate voltage generation circuit for generating a first gate voltage based on the output voltage of said temperature detection circuit; and
a second gate voltage generation circuit for generating a second gate voltage based on the output voltage of said temperature detection circuit,
an output terminal for outputting said first gate voltage of said first gate voltage generation circuit being connected to a gate of said first MOS transistor,
an output terminal for outputting said second gate voltage of said second gate voltage generating circuit being connected to a gate of said second MOS transistor, and
a drain of said first MOS transistor and a drain of said second MOS transistor being commonly connected to be an output terminal of said control voltage.

4. The temperature compensated oscillator according to claim 1,
wherein said control voltage generation circuit outputs the cubic term voltage generated by said cubic term voltage generation circuit as a first control voltage, further comprises a linear term voltage generation circuit for generating a linear term voltage based on the output voltage of said temperature detection circuit, and outputs the linear term voltage generated by said linear term voltage generation circuit as a second control voltage, and
wherein said frequency adjustment circuit is a circuit for controlling the oscillation frequency of said oscillation circuit by said first control voltage and said second control voltage.

5. The temperature compensated oscillator according to claim 1,
wherein said temperature detection circuit is a circuit which comprises two temperature sensors different in temperature gradient and divides a difference between output voltages of said two temperature sensors into an arbitrary ratio to output it as a temperature detection voltage.

6. The temperature compensated oscillator according to claim 1,
wherein said control voltage generation circuit is a circuit which outputs the cubic term voltage generated by said cubic term voltage generation circuit as a first control voltage, further comprises a linear term voltage generation circuit for generating a linear term voltage based on the output voltage of said temperature detection circuit, and outputs the linear term voltage generated by said linear term voltage generation circuit as a second control voltage,
wherein said control voltage generation circuit further comprises an external control voltage input circuit including an operational amplifier circuit for inputting thereto an external voltage for adjusting a frequency from an outside to generate an output voltage,
wherein said control voltage generation circuit inputs the output voltage outputted from said external control voltage input circuit as an offset input voltage of an operational amplifier circuit constituting said linear term voltage generation circuit, an amplification factor and an offset input voltage of said operational amplifier circuit constituting said external control voltage input circuit being controlled by digital data stored in a memory circuit, and
wherein said frequency adjustment circuit is a circuit for controlling the oscillation frequency of said oscillation circuit by said first control voltage and said second control voltage.

7. The temperature compensated oscillator according to claim 3,
wherein said output terminal of said control voltage is further connected to said first power line or a power line having the same polarity as that of said first power line via a first resistance element as well as to said second power line or a power line having the same polarity as that of said second power line via a second resistance element.

8. The temperature compensated oscillator according to claim 7,
wherein said first resistance element and said second resistance element are different in temperature coefficient with respect to resistance value.

9. The temperature compensated oscillator according to claim 8,
wherein a plurality of pairs of resistance elements having different combinations of temperature coefficients with respect to resistance values are provided as said first resistance element and said second resistance element, and switches for selectively switching to any of said plurality of pairs of resistance elements for use are provided.

10. The temperature compensated oscillator according to claim 4,
wherein said linear term voltage generation circuit is an operational amplifier circuit.

11. The temperature compensated oscillator according to claim 10,
wherein a memory circuit is provided which stores data from an outside and controls an amplification factor and an offset input voltage of said operational amplifier circuit based on the stored digital data.

12. The temperature compensated oscillator according to claim 4,
wherein said frequency adjustment circuit comprises a capacitance element constituting a load capacitance of said oscillation circuit and being a voltage variable capacitance element of which capacitance value is changed by said control voltage, such that said first control voltage is applied to one electrode of said voltage variable capacitance element and said second control voltage is applied to other electrode of said voltage variable capacitance element.

13. The temperature compensated oscillator according to claim 4,
wherein said frequency adjustment circuit comprises capacitance elements constituting a load capacitance of said oscillation circuit and being voltage variable capacitance elements of which capacitance values are changed by said control voltage, and
wherein said voltage variable capacitance elements are constituted by a first voltage variable capacitance element to which said first control voltage is applied and a second voltage variable capacitance element to which said second control voltage is applied which are connected in parallel.

14. The temperature compensated oscillator according to claim 3,
wherein said output terminal of said control voltage is further connected to at least one arbitrary voltage source via a resistance element.

15. The temperature compensated oscillator according to claim 14,
wherein said resistance element has a resistance value of 100 kilohms or more.

16. The temperature compensated oscillator according to claim 3,
wherein at least one of said first and second gate voltage generation circuits is a circuit for generating said first or said second gate voltage based on a difference between the output voltage of said temperature detection circuit and an arbitrary reference voltage.

17. The temperature compensated oscillator according to claim 16,
wherein at least one of said first and second gate voltage generation circuits is a voltage division circuit for dividing a voltage difference between the output voltage of said temperature detection circuit and said arbitrary reference voltage.

18. The temperature compensated oscillator according to claim 16,
wherein said reference voltage applied to at least one of said first and second gate voltage generation circuits is a voltage of said first power line or said second power line.

19. The temperature compensated oscillator according to claim 3,
wherein at least one of said first and second gate voltage generation circuits is a circuit capable of controlling the generated gate voltage thereof based on external data.

20. The temperature compensated oscillator according to claim 19,
wherein, a memory circuit for storing said external data is provided, and at least one of said first and second gate voltage generation circuits is a circuit capable of controlling the generated gate voltage thereof based on said data stored in said memory circuit.

21. The temperature compensated oscillator according to claim 20,
wherein said memory circuit is capable of controlling storage and read of digital data from an outside via a serial input/output line.

22. The temperature compensated oscillator according to claim 3,
wherein said frequency adjustment circuit comprises a capacitance element constituting a load capacitance of said oscillation circuit and being a voltage variable capacitance element of which capacitance value is changed by said control voltage.

23. The temperature compensated oscillator according to claims 22,
wherein said voltage variable capacitance element is an MIS variable capacitor.

24. The temperature compensated oscillator according to claim 3,
wherein said each source of said first and second MOS transistors is connected to said first or second power line via a resistance element for limiting a drain current.

25. The temperature compensated oscillator according to claim 24,
wherein said resistance element is a digital control variable resistance circuit, and
wherein a memory circuit is provided which is capable of controlling a resistance value of said digital control variable resistance circuit based on digital data stored therein.

26. The temperature compensated oscillator according to claim 3,
wherein said temperature detection circuit includes:
a P-channel MOS transistor having a source connected to a first power line of said temperature detection circuit and a drain connected to a second power line thereof via a resistance element; and
a gate voltage generator for supplying a gate voltage exceeding a threshold voltage of said P-channel MOS transistor to a gate of said P-channel MOS transistor, and
wherein said temperature detection circuit outputs a voltage generated at a connection point between said drain of said P-channel MOS transistor and said resistance element as a temperature detection voltage.

27. The temperature compensated oscillator according to claim 26,
wherein said source of said P-channel MOS transistor is connected to said first power line via a resistance element.

28. The temperature compensated oscillator according to claim 26,
wherein said temperature detection circuit outputs the voltage generated at said connection point between said drain of said P-channel MOS transistor and said resistance element as the temperature detection voltage via an operational amplifier circuit.

29. The temperature compensated oscillator according to claim 3,
wherein said temperature detection circuit includes:
an N-channel MOS transistor having a drain connected to a first power line of said temperature detection circuit via a resistance element and a source connected to a second power line thereof; and
a gate voltage generator for supplying a gate voltage exceeding a threshold voltage of said N-channel MOS transistor to a gate of said N-channel MOS transistor, and
wherein said temperature detection circuit outputs a voltage generated at a connection point between said drain of said N-channel MOS transistor and said resistance element as a temperature detection voltage.

30. The temperature compensated oscillator according to claim 29,
wherein said source of said N-channel MOS transistor is connected to said first power line via a resistance element.

31. The temperature compensated oscillator according to claim 29,
wherein said temperature detection circuit outputs the voltage generated at said connection point between said drain of said N-channel MOS transistor and said resistance element as the temperature detection voltage via an operational amplifier circuit.

32. The temperature compensated oscillator according to claim 4,
wherein when a preset temperature range in a temperature range in use is defined as a second temperature area, a temperature range on a lower temperature side than that is defined as a first temperature area, and a temperature range on a high temperature side exceeding said second temperature area is defined as a third temperature area,
said first gate voltage generation circuit has an area in which said first gate voltage linearly changes with respect to changes in temperature at least in said third temperature area, and
said second gate voltage generation circuit has an area in which said second gate voltage linearly changes with respect to changes in temperature at least in said first temperature area.

33. A temperature compensated oscillator, comprising:
an oscillation circuit;
a frequency adjustment circuit for changing an oscillation frequency of said oscillation circuit by a control voltage;
a temperature detection circuit for detecting a temperature in a vicinity of said oscillation circuit and generating at least one output voltage based on the detected temperature; and
a control voltage generation circuit including a quadratic term voltage generation circuit for generating a quadratic term voltage as said control voltage based on the output voltage from said temperature detection circuit,
wherein said quadratic term voltage generation circuit includes a first circuit which generates a voltage curve projecting upward by a first square law and a second circuit which generates a voltage curve projecting upward by a second square law, each depending on an input voltage based on the output voltage from said temperature detection circuit respectively.

34. The temperature compensated oscillator according to claim 33,
wherein said quadratic term voltage generation circuit is a circuit which generates the quadratic term voltage by connecting the voltage curve projecting upward generated by said first circuit and the voltage curve projecting upward generated by said second circuit, under control of said first circuit and said second circuit.

35. The temperature compensated oscillator according to claim 34,
wherein said first circuit includes a first MOS transistor having a source connected to a first power line,
wherein said second circuit includes a second MOS transistor having a same conduction type as that of said first MOS transistor and a source connected to a second power line, and
wherein said cubic term voltage generation circuit further comprises:
a first gate voltage generation circuit for generating a first gate voltage based on the output voltage of said temperature detection circuit; and
a second gate voltage generation circuit for generating a second gate voltage based on the output voltage of said temperature detection circuit,
an output terminal for outputting said first gate voltage of said first gate voltage generation circuit being connected to a gate of said first MOS transistor,
an output terminal for outputting said second gate voltage of said second gate voltage generating circuit being connected to a gate of said second MOS transistor, and
a drain of said first MOS transistor and a drain of said second MOS transistor being commonly connected to be an output terminal of said control voltage.

* * * * *